(12) United States Patent
Masuda et al.

(10) Patent No.: US 11,130,335 B2
(45) Date of Patent: Sep. 28, 2021

(54) PIEZOELECTRIC THIN-FILM ELEMENT, LIQUID DISCHARGE HEAD, HEAD MODULE, LIQUID DISCHARGE DEVICE, LIQUID DISCHARGE APPARATUS, AND METHOD FOR MANUFACTURING PIEZOELECTRIC THIN-FILM ELEMENT

(71) Applicant: Ricoh Company, Ltd., Tokyo (JP)

(72) Inventors: Toshiaki Masuda, Kanagawa (JP); Keishi Miwa, Kanagawa (JP); Takahiko Kuroda, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/815,071

(22) Filed: Mar. 11, 2020

(65) Prior Publication Data

US 2020/0298570 A1 Sep. 24, 2020

(30) Foreign Application Priority Data

Mar. 19, 2019 (JP) .............................. JP2019-051173

(51) Int. Cl.
*B41J 2/14* (2006.01)
*B41J 2/165* (2006.01)
*H01L 41/187* (2006.01)
*H01L 41/25* (2013.01)
*H01L 41/09* (2006.01)

(52) U.S. Cl.
CPC .......... *B41J 2/14233* (2013.01); *B41J 2/165* (2013.01); *H01L 41/0973* (2013.01); *H01L 41/1876* (2013.01); *H01L 41/25* (2013.01); *B41J 2002/14258* (2013.01)

(58) Field of Classification Search
None
See application file for complete search history.

(56) References Cited

U.S. PATENT DOCUMENTS

| 6,398,349 B1* | 6/2002 | Murai | B41J 2/161 |
| | | | 347/68 |
| 2003/0218644 A1* | 11/2003 | Higuchi | H01L 41/0815 |
| | | | 347/1 |
| 2013/0250009 A1* | 9/2013 | Ishimori | B41J 2/1645 |
| | | | 347/70 |
| 2014/0267509 A1 | 9/2014 | Shinkai et al. | |
| 2015/0022592 A1 | 1/2015 | Aoyama et al. | |
| (Continued) | | | |

FOREIGN PATENT DOCUMENTS

| JP | 2001-270105 | 10/2001 |
| JP | 2004-048639 | 2/2004 |
| (Continued) | | |

*Primary Examiner* — Erica S Lin

(74) *Attorney, Agent, or Firm* — Xsensus LLP

(57) ABSTRACT

A piezoelectric thin-film element includes a diaphragm plate on a substrate; a lower electrode on the diaphragm plate; a piezoelectric film on the lower electrode, the piezoelectric film containing Pb; and an upper electrode on the piezoelectric film. The diaphragm plate is a laminate in which a silicon oxide layer, a silicon nitride layer, and an amorphous layer containing a metal oxide to trap Pb of the piezoelectric film are laminated in turn on the substrate. The amorphous layer has a thickness of preventing Pb of the piezoelectric film from reaching the silicon nitride layer.

15 Claims, 20 Drawing Sheets

(56) References Cited

U.S. PATENT DOCUMENTS

| | | |
|---|---|---|
| 2015/0171307 A1 | 6/2015 | Masuda et al. |
| 2016/0001556 A1 | 1/2016 | Masuda et al. |
| 2017/0100934 A1 | 4/2017 | Masuda et al. |
| 2017/0253040 A1 | 9/2017 | Shinkai et al. |
| 2019/0044055 A1 | 2/2019 | Kondo et al. |
| 2019/0270310 A1 | 9/2019 | Masuda et al. |

FOREIGN PATENT DOCUMENTS

| | | |
|---|---|---|
| JP | 2005-168172 | 6/2005 |
| JP | 2005-295786 | 10/2005 |
| JP | 2008-244201 | 10/2008 |
| JP | 2009-274226 | 11/2009 |
| JP | 2012-158011 | 8/2012 |
| JP | 2013-065698 | 4/2013 |
| JP | 2014-154740 | 8/2014 |
| JP | 2015-082541 | 4/2015 |
| JP | 2016-062984 | 4/2016 |
| JP | 2017-205955 | 11/2017 |
| JP | 2017-213713 | 12/2017 |

\* cited by examiner

PIEZOELECTRIC THIN-FILM ELEMENT, LIQUID DISCHARGE HEAD, HEAD MODULE, LIQUID DISCHARGE DEVICE, LIQUID DISCHARGE APPARATUS, AND METHOD FOR MANUFACTURING PIEZOELECTRIC THIN-FILM ELEMENT

CROSS-REFERENCE TO RELATED APPLICATION

This patent application is based on and claims priority pursuant to 35 U.S.C. § 119(a) to Japanese Patent Application No. 2019-051173, filed on Mar. 19, 2019, in the Japan Patent Office, the entire disclosure of which is incorporated by reference herein.

BACKGROUND

Technical Field

Aspects of the present disclosure relates to a piezoelectric thin-film element, a liquid discharge head, a head module, a liquid discharge device, a liquid discharge apparatus, and a method for manufacturing a piezoelectric thin-film element.

Related Art

In general, examples of a printer, a facsimile, a copier, a plotter, or an image forming apparatus combining a plurality of functions among functions of these apparatuses include an inkjet recording apparatus including a liquid discharge head that discharges liquid such as ink.

As the liquid discharge head, a configuration including a nozzle that discharges liquid such as ink, a liquid chamber that communicates with the nozzle and stores liquid (also referred to as pressure chamber, pressurization chamber, discharge chamber, or the like), and an electro-mechanical transducer element such as a piezoelectric element is known. In this liquid discharge head, a voltage is applied to the piezoelectric element, and the piezoelectric element thereby vibrates so as to deform a diaphragm plate forming a part of a wall of the liquid chamber. The deformation of the diaphragm plate pressurizes the liquid in the liquid chamber to discharge liquid from the nozzle.

Conventionally, for the purpose of obtaining a good piezoelectric element, a is known technique in which a diaphragm plate has a laminated structure.

SUMMARY

In an aspect of the present disclosure, there is provided a piezoelectric thin-film element that includes a diaphragm plate on a substrate; a lower electrode on the diaphragm plate; a piezoelectric film on the lower electrode, the piezoelectric film containing Pb; and an upper electrode on the piezoelectric film. The diaphragm plate is a laminate in which a silicon oxide layer, a silicon nitride layer, and an amorphous layer containing a metal oxide to trap Pb of the piezoelectric film are laminated in turn on the substrate. The amorphous layer has a thickness of preventing Pb of the piezoelectric film from reaching the silicon nitride layer.

In another aspect of the present disclosure, there is provided a liquid discharge head including the piezoelectric thin-film element.

In another aspect of the present disclosure, there is provided a head module including a plurality of liquid discharge heads, including the liquid discharge head, arranged in the head module.

In another aspect of the present disclosure, there is provided a liquid discharge device including the head module or the liquid discharge head.

In another aspect of the present disclosure, there is provided a liquid discharge apparatus including the liquid discharge device, the head module, or the liquid discharge head.

In another aspect of the present disclosure, there is provided a method for manufacturing the piezoelectric thin-film element. The method includes forming the silicon oxide layer, the silicon nitride layer, and the amorphous layer containing the metal oxide to trap Pb of the piezoelectric film in turn on the substrate to form the diaphragm plate. The forming forms the amorphous layer at the thickness of preventing Pb of the piezoelectric film from reaching the silicon nitride layer.

BRIEF DESCRIPTION OF THE DRAWINGS

The aforementioned and other aspects, features, and advantages of the present disclosure would be better understood by reference to the following detailed description when considered in connection with the accompanying drawings, wherein.

Figure 1:
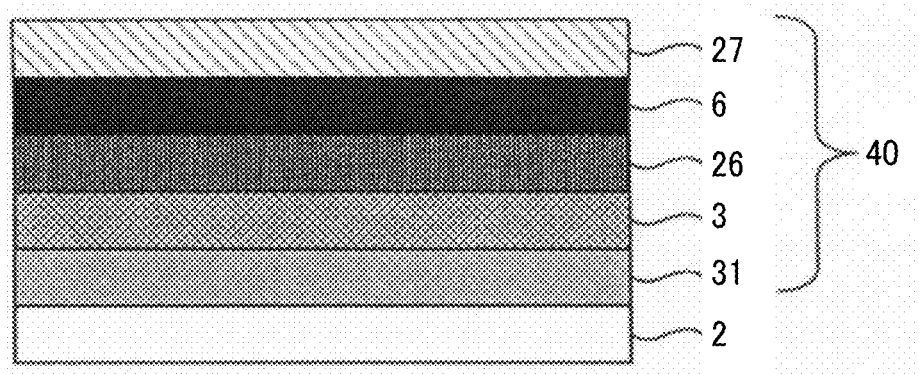
FIG. 1 is a schematic view illustrating a cross section of a piezoelectric thin-film element according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Hereinafter, a piezoelectric thin-film element, a liquid discharge head, a head module, a liquid discharge device, a liquid discharge apparatus, and a method for manufacturing a piezoelectric thin-film element according to embodiments of the present disclosure will be described with reference to the drawings. Note that the present disclosure is not limited to the embodiments described below but can be changed within a range which a person skilled in the art can conceive of, for example, by another embodiment, addition, modification, or deletion. Any aspect is included in the scope of the present disclosure as long as exhibiting an action and an effect of the present disclosure.

Conventionally, lead (Pb) contained in a piezoelectric film on a diaphragm plate may diffuse into the diaphragm plate, and an internal stress and rigidity of the diaphragm plate fluctuate from target values at the time of design disadvantageously. When the internal stress and rigidity of the diaphragm plate fluctuate from the target values at the time of design, target displacement characteristics cannot be obtained, and stable discharge characteristics cannot be obtained. Therefore, there is a demand for a technique that can simultaneously achieve stress control of a diaphragm plate and prevention of a change in rigidity due to diffusion of lead, and that can bring about good discharge characteristics.

Hence, a piezoelectric thin-film element according to an embodiment of the present disclosure includes a diaphragm plate on a substrate, a lower electrode on the diaphragm plate, a Pb-containing piezoelectric film on the lower electrode, and an upper electrode on the piezoelectric film. The diaphragm plate is a laminate obtained by laminating a silicon oxide layer, a silicon nitride layer, and an amorphous layer containing a metal oxide and capable of trapping Pb of the piezoelectric film in this order. The thickness of the amorphous layer is set such that Pb of the piezoelectric film does not reach the silicon nitride layer.

In at least one embodiment of the present disclosure, by using a silicon oxide layer having a compressive stress and a silicon nitride layer having a tensile stress for the diaphragm plate, a stress of the diaphragm plate can be controlled to a desired value. In addition, by using an amorphous layer having a predetermined thickness for the diaphragm plate, for example, lead (Pb) diffused from lead zirconate titanate (PZT) used for the piezoelectric film can be prevented from entering the silicon oxide layer or the silicon nitride layer. As a result, a change in rigidity of the diaphragm plate caused by diffusion of lead can be prevented, a stress is controlled so as to be maintained at a target value, and good discharge characteristics can be obtained. Therefore, an embodiment of the present disclosure can control a stress of the diaphragm plate, can prevent a change in rigidity of the diaphragm plate caused by diffusion of lead derived from the piezoelectric film into the diaphragm plate, and can bring about good discharge characteristics.

Piezoelectric Thin-Film Element

Figure 2:
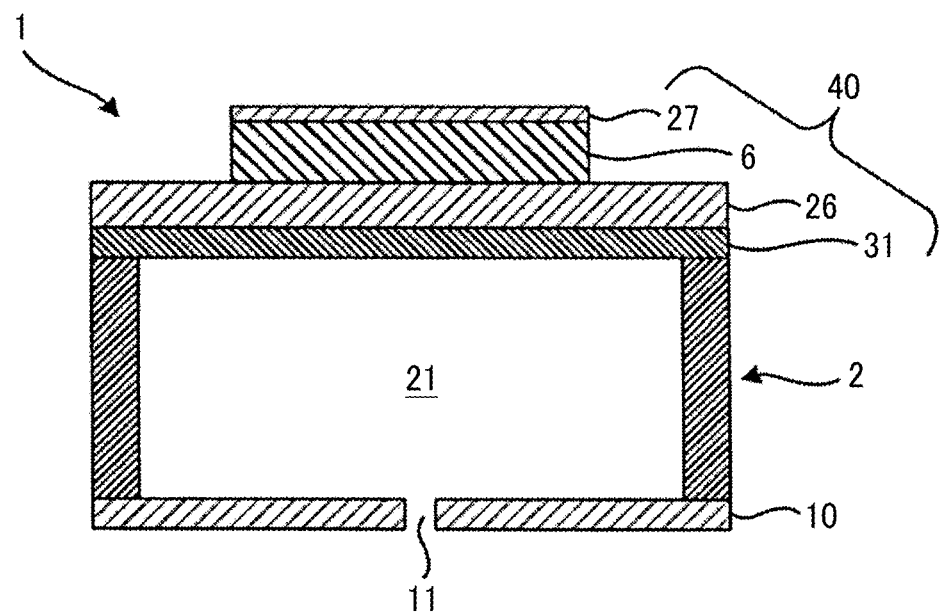
FIG. 2 is a schematic view illustrating a cross section of a liquid discharge head including a piezoelectric thin-film element according to an embodiment of the present disclosure.
Figure 3:
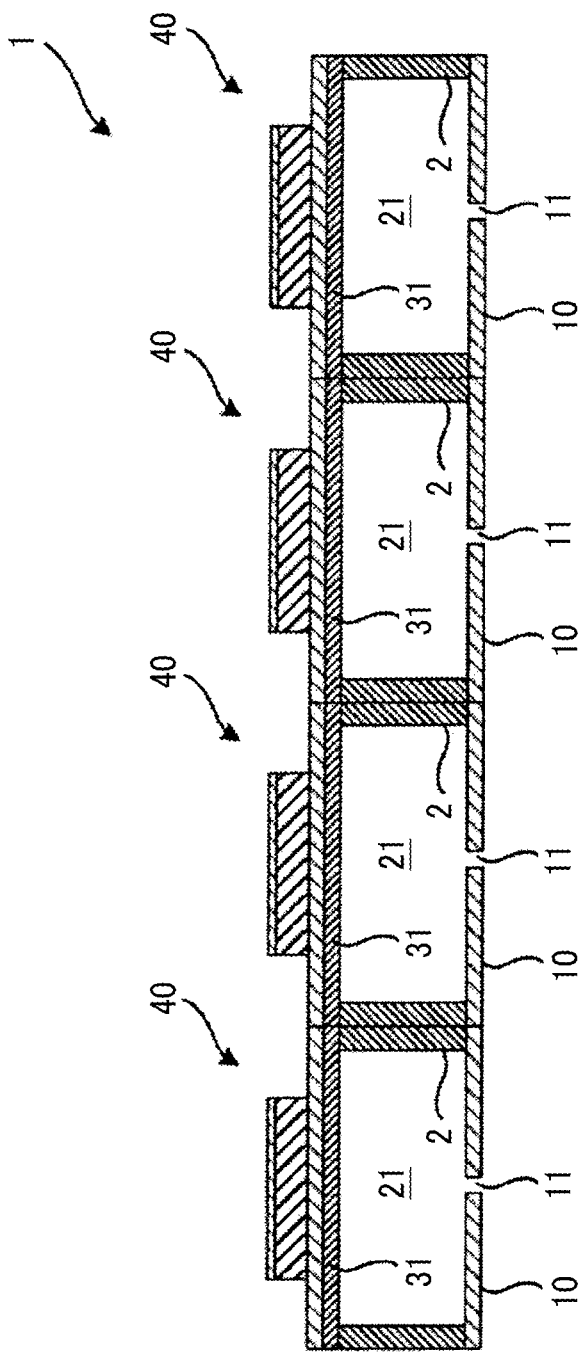
FIG. 3 is a schematic view illustrating a cross section of a series of liquid discharge heads each including a piezoelectric thin-film element according to an embodiment of the present disclosure.

FIG. 1 illustrates a schematic cross-sectional view of a piezoelectric thin-film element of the present embodiment. A piezoelectric thin-film element (also referred to as "piezoelectric element") 40 includes a diaphragm plate 31 that is a film formation diaphragm plate on a substrate 2 as a base film on the substrate 2, an adhesion layer 3 on the diaphragm plate 31, a lower electrode 26 on the adhesion layer 3, a piezoelectric film 6 on the lower electrode 26, and an upper electrode 27 on the piezoelectric film 6. FIGS. 2 and 3 are schematic cross-sectional views of a liquid discharge head including the piezoelectric thin-film element of the present embodiment.

In this case, the lower electrode 26 is indirectly formed on the diaphragm plate 31 via the adhesion layer 3. However, the lower electrode 26 may be formed directly on the diaphragm plate 31 by omitting the adhesion layer 3. The adhesion layer 3 may be included in the lower electrode 26. The diaphragm plate 31 in the present embodiment is directly formed on the substrate 2. In the present embodiment, the piezoelectric thin-film element 40 is a piezoelectric element including the piezoelectric film 6 as a piezoelectric film, and the upper electrode 27 is an individual electrode.

Substrate

As the substrate 2, a silicon single crystal substrate is preferably used, and usually, the substrate 2 preferably has a thickness of 100 to 600 µm. There are three types of plane orientations: (100), (110) and (111), but in general, (100) and (111) are widely used in a semiconductor industry. A single crystal substrate with a (100) plane orientation can be mainly used in the present configuration.

In a case where a pressure chamber 21 as illustrated in FIG. 2 or 3 is manufactured, a silicon single crystal substrate is processed using etching. As an etching method in this case, in general, anisotropic etching is used. Anisotropic etching utilizes a property that the etching rate differs depending on a plane orientation of a crystal structure. For example, in anisotropic etching in which a substrate is immersed in an alkaline solution such as KOH, the etching rate of the plane (111) is about 1/400 that of the plane (100). Therefore, in the plane orientation (100), a structure with an inclination of about 54.74° is manufactured. Meanwhile, in the plane orientation (110), a deep groove can be formed, and therefore it is known that arrangement density can be increased while rigidity is maintained. Therefore, in the present configuration, a single crystal substrate having the plane orientation (110) can also be used. However, in this case, $SiO_2$ which is a mask material is also etched, and therefore this point is taken into consideration.

The diaphragm plate 31 is deformed and displaced by a force generated by the piezoelectric film 6, and discharges ink in the pressure chamber 21 as ink droplets. Therefore, the diaphragm plate 31 preferably has a predetermined strength.

Diaphragm Plate

The diaphragm plate of the present embodiment is a laminate obtained by laminating a silicon oxide layer, a silicon nitride layer, and an amorphous layer in this order. With such a layer configuration, it is possible to ensure hardness (rigidity) and to adjust the amount of bending of a structure in a state where the piezoelectric element is formed on the diaphragm plate by controlling a stress. The film thickness is determined such that the stress is a desired value.

The silicon oxide layer (also referred to as silicon oxide film) functions as a layer having a compressive stress in the diaphragm plate, and the silicon oxide layer having a predetermined thickness makes it possible to ensure the rigidity of the diaphragm plate. Moreover, the silicon oxide layer can also impart a function as an etching stop layer. The thickness of the silicon oxide layer is preferably 0.6 µm to 2.0 µm, for example. Within this range, a stress of the diaphragm plate can be easily controlled to a desired value.

The silicon nitride layer (also referred to as a silicon nitride film) functions as a layer having a tensile stress in the diaphragm plate. The thickness of the silicon nitride layer is preferably 0.05 µm to 0.3 µm or less, for example. Within this range, a stress of the diaphragm plate can be easily controlled to a desired value.

The amorphous layer contains a metal oxide, and functions, for example, as a layer that can trap lead (Pb) derived from lead zirconate titanate (PZT) used for the piezoelectric film (also referred to as a lead diffusion prevention layer, a lead trap layer, or a lead block layer). The thickness of the amorphous layer is set such that Pb of the piezoelectric film does not reach the silicon nitride layer.

In the electrode layer and the piezoelectric film on the diaphragm plate, there is a crystal grain boundary that is a boundary between crystallized parts, and therefore lead used in the piezoelectric film oozes out to a lower layer and enters the lower layer. When lead in a case of using PZT or the like enters the silicon nitride layer or the silicon oxide layer in the diaphragm plate, material characteristics change and a designed stress value changes. As a result, the displacement and rigidity of the diaphragm plate change, and stable discharge cannot be obtained.

In contrast, by disposing the amorphous layer having an amorphous (non-crystalline) structure in the present embodiment on the silicon oxide layer and the silicon nitride layer in the diaphragm plate, enter of lead derived from PZT into the silicon nitride layer or the silicon oxide layer that is a lower layer can be suppressed. The amorphous layer traps lead derived from PZT, and enter of lead into the silicon nitride layer or the silicon oxide layer as a lower layer can be thereby suppressed.

Figure 4:
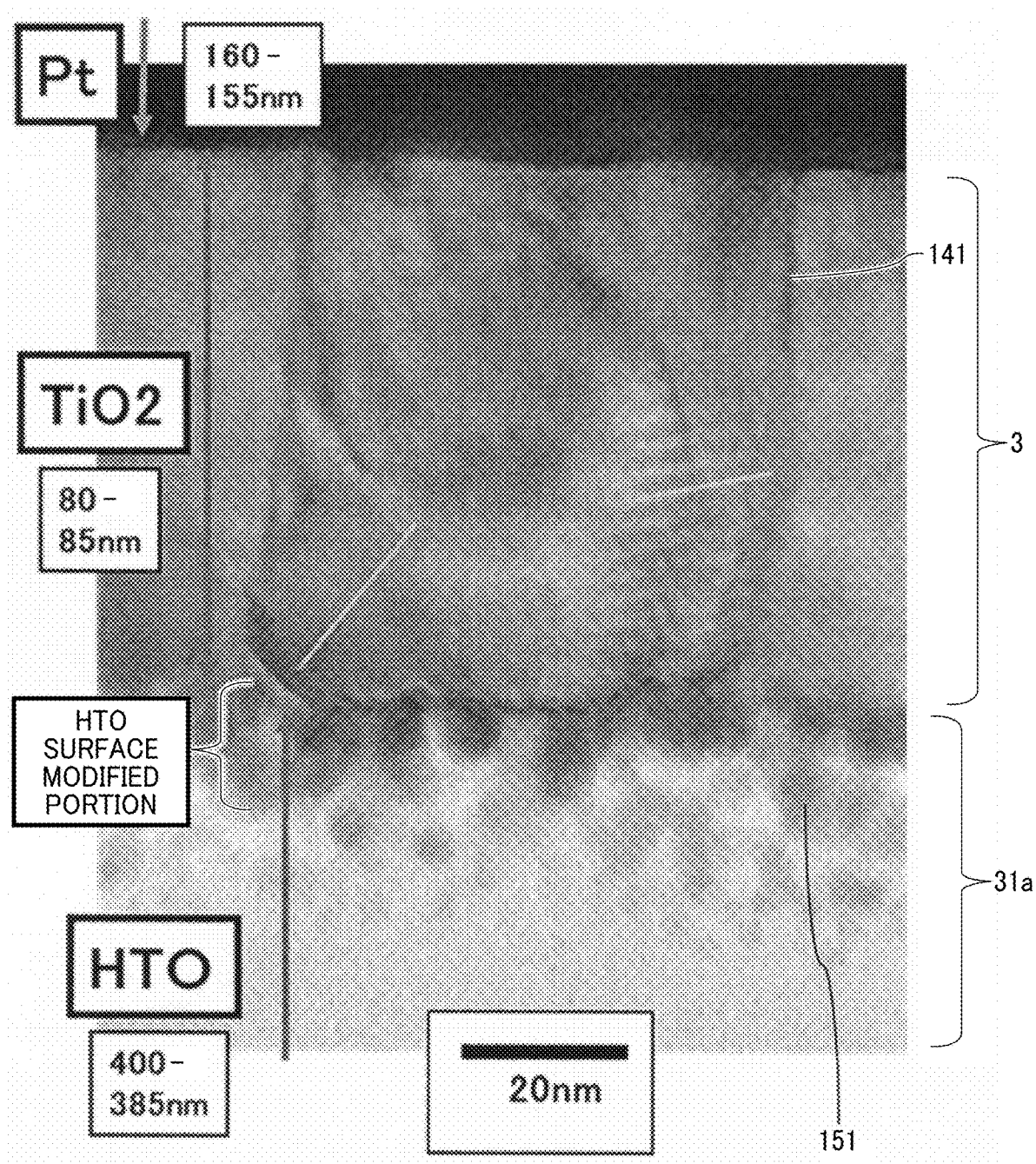
FIG. 4 is an electron micrograph of a cross section of a piezoelectric thin-film element according to an embodiment of the present disclosure.

FIG. 4 illustrates an example of a transmission electron microscope (TEM) image of a cross section of the piezoelectric thin-film element in the present embodiment. FIG. 4 illustrates an example in which the adhesion layer 3 is formed on an amorphous layer 31*a* in the diaphragm plate 31. Note that the numerical values are examples of the film thicknesses, and are not limited thereto. Here, a case where $TiO_2$ is used for the adhesion layer 3, and $SiO_2$ is used for the amorphous layer 31*a* is illustrated. In FIG. 4, HTO is an abbreviation for high temperature oxide.

A crystal grain boundary 141 is formed in the adhesion layer 3, and lead derived from the piezoelectric film passes through the crystal grain boundary 141 and diffuses into the diaphragm plate. As illustrated in FIG. 4, since the amorphous layer 31*a* is formed, the diffused lead is trapped by the amorphous layer 31*a*. The trapped lead is a portion indicated by a black shadow in FIG. 4 and is indicated by reference numeral 151. As in the present embodiment, since the thickness of the amorphous layer 31*a* is set such that Pb of the piezoelectric film does not reach the silicon nitride layer, an influence on the silicon oxide layer and the silicon nitride layer in the diaphragm plate can be suppressed.

Figure 5:
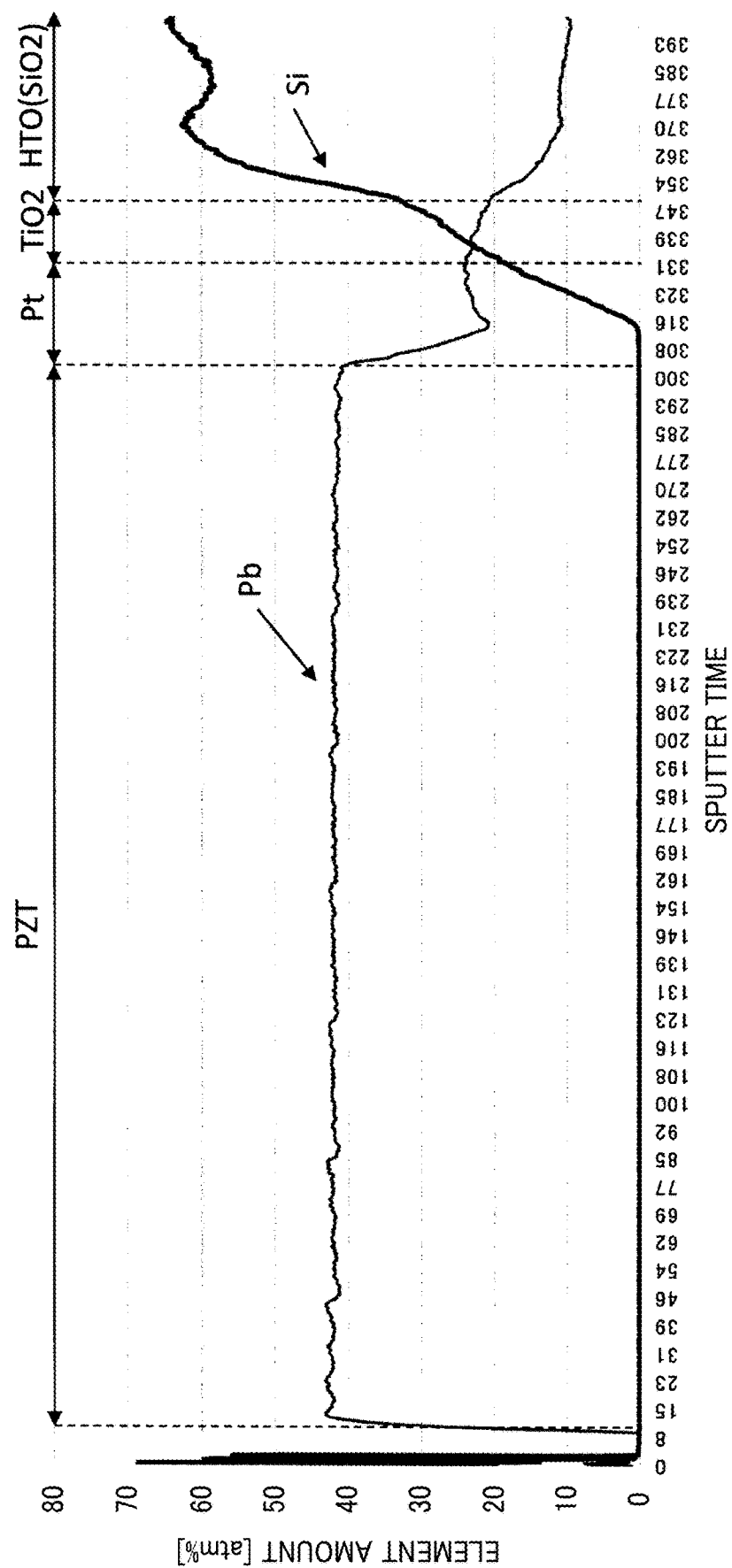
FIG. 5 illustrates a result of measurement of an element amount of a piezoelectric thin-film element according to another embodiment of the present disclosure in a depth direction of a sample.

FIG. 5 illustrates an example of results of quantitative analysis of elements of a sample in a depth direction thereof using glow discharge optical emission spectroscopy (GDOES). The vertical axis indicates an element amount (atm %), and the horizontal axis indicates sputtering time. The sputtering time corresponds to the depth of a sample. In the example illustrated in FIG. 5, PZT is used as the piezoelectric film, Pt and $TiO_2$ (adhesion layer) are used as the lower electrode layer, and $SiO_2$ is used as the amorphous layer.

As illustrated in FIG. 5, it is found that lead enters the amorphous layer, but the content (atm %) thereof in the amorphous layer decreases as the location of a sample is deeper in the depth direction of the sample. Here, the Pb content (atm %) rapidly decreases to about half the depth of the amorphous layer. Therefore, it is found that the amorphous layer functions as a lead diffusion prevention layer. Note that in FIG. 5, the Pb content (atm %) seems to converge to 10 atm % in the amorphous layer, but because of a measurement principle, Pb of PZT in an upper layer is detected during measurement, and therefore a value that is higher than the actual content is detected.

The numerical value of the thickness of the amorphous layer by which Pb of the piezoelectric film does not reach the silicon nitride layer varies depending on the amount of Pb in the piezoelectric film, the configuration of the amorphous layer, and the like. Therefore, it is difficult to specify the numerical value in general, but the thickness of the amorphous layer is preferably 40 nm or more. When the thickness of the amorphous layer is nm or more, it is easy to prevent Pb of the piezoelectric film from reaching the silicon nitride layer.

The thickness of the amorphous layer by which Pb of the piezoelectric film does not reach the silicon nitride layer is also adjusted by formation conditions of the piezoelectric film. For example, in a case where PZT is used for the piezoelectric film, when the amount of Pb (Pb/(Zr+Ti)) in a PZT precursor solution is 4% to 10%, the thickness of the amorphous layer is preferably 20 nm to 80 nm. In this case, a good piezoelectric film can be obtained, and at the same time, diffusion of lead into the silicon nitride layer can be reliably prevented.

The state of a crystal grain boundary varies depending on the crystal state of the piezoelectric film, and the degree of diffusion of lead to a lower layer varies depending on the state of the crystal grain boundary. The crystal state of the piezoelectric film varies depending on, for example, the temperature of a crystallization heat treatment. For example, when the temperature of the crystallization heat treatment is 650° C. to 750° C., the thickness of the amorphous layer is preferably 20 nm to 80 nm. In this case, a good piezoelectric film can be obtained, and at the same time, diffusion of lead into the silicon nitride layer can be reliably prevented.

The metal oxide contained in the amorphous layer is not particularly limited as long as being able to trap lead contained in PZT, but is preferably silicon oxide or aluminum oxide.

An upper limit of the thickness of the amorphous layer varies depending on the amount of Pb in the piezoelectric film, the configuration of the amorphous layer, and the like. Therefore, it is difficult to specify the upper limit value in general, but an appropriate upper value limit is set in consideration of film formation time, or an upper limit value is set in relation to stress adjustment. By forming the amorphous layer as thin as possible, even if lead enters the amorphous layer and is trapped by the amorphous layer, an influence on a stress of the entire diaphragm plate can be reduced. It is difficult to specify the upper limit value in general, but the thickness of the amorphous layer is preferably 300 nm or less.

Presence or absence of an amorphous structure can be determined by performing cross-sectional transmission electron microscope (TEM) analysis.

The diaphragm plate can be formed by, for example, a low pressure chemical vapor deposition (LPCVD) method, an atomic layer deposition (ALD) method, or a heat treatment film formation method. In a method for manufacturing the amorphous layer in the diaphragm plate, a method such as chemical vapor deposition (CVD) or ALD is preferably used.

As an example of film formation of the diaphragm plate, first, a silicon oxide film is formed on a silicon single crystal substrate by a heat treatment film formation method. Subsequently, a silicon nitride film is formed by an LPCVD method similarly, and next, an amorphous layer is formed by an ALD method to form a diaphragm plate.

A relationship between the thickness of the silicon oxide layer and the thickness of the silicon nitride layer in the diaphragm plate can be changed appropriately. However, the thickness of the silicon oxide layer is preferably larger than the thickness of the silicon nitride layer.

Figure 6:
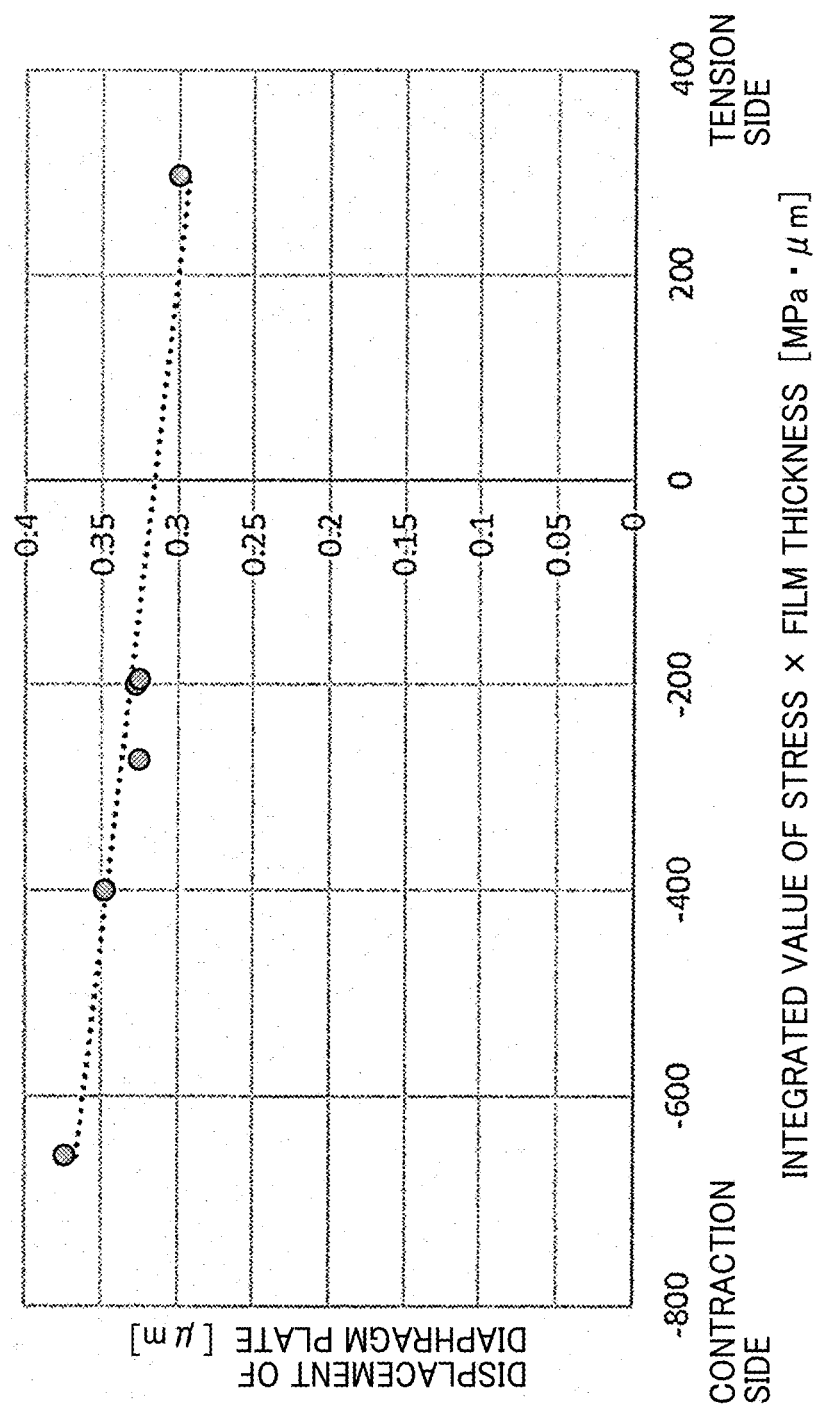
FIG. 6 is a graph illustrating a relationship between an integrated value of a stress and film thickness of each layer of a diaphragm plate and a displacement of the diaphragm plate.

FIG. 6 illustrates a relationship between an integrated value of a stress and film thickness of each layer of the diaphragm plate and a displacement of the diaphragm plate facing a pressurizing liquid chamber 15 opposing to a piezoelectric element 40 when a voltage is applied to the piezoelectric element 40. As illustrated in FIG. 6, there is a correlation between a stress and a displacement, and the displacement increases as a compressive stress increases. Note that the integrated value is determined as stress value of silicon oxide layer×film thickness of silicon oxide layer+ stress value of silicon nitride layer×film thickness of silicon nitride layer.

In general, silicon nitride has a larger absolute value of stress than silicon oxide. For this reason, as in the present embodiment, by making the thickness of the silicon oxide layer having a compressive stress larger than the thickness of the silicon nitride layer having a tensile stress, the total stress can be made close to zero. By making the total stress of the silicon oxide layer and the silicon nitride layer close to zero, the diaphragm plate can have an appropriate rigidity while ensuring a displacement amount in the diaphragm.

Electrode Next, the lower electrode 26 is preferably a layer having a (111) orientation. However, when the lower electrode 26 includes the adhesion layer 3, a part or the whole excluding the adhesion layer 3 is preferably a layer having a (111) orientation. In this regard, the lower electrode 26 includes a layer having a (111) orientation. Examples of a material of the lower electrode 26 include a metal or a metal oxide mainly containing at least one selected from Pt, Ir, $IrO_2$, $RuO_2$, $LaNiO_3$, and $SrRuO_3$, and a combination thereof. As a metal material constituting the lower electrode 26, platinum having high heat resistance and low reactivity has been used conventionally. However, platinum does not have a sufficient barrier property against lead in some cases. Therefore, examples of the metal material constituting the lower electrode 26 include platinum group elements such as iridium and platinum-rhodium and alloy films of these elements.

As a method for manufacturing the lower electrode 26, vacuum film formation such as a sputtering method or a vacuum vapor deposition method is generally used. The film thickness of the lower electrode 26 is preferably 0.05 to 1 μm, and more preferably 0.1 to 0.5 μm. At this time, when PZT is selected as the piezoelectric film 6, PZT preferably has a (111) orientation as its crystallinity. Therefore, examples of a material of the lower electrode 26 include Pt having a high (111) orientation.

Examples of a material of the adhesion layer 3 include Ti, $TiO_2$, Ta, and $Ta_3N_5$, and the adhesion layer 3 is laminated before lamination of the lower electrode 26 to be formed. This can improve adhesion between a base formed by the diaphragm plate 31 and the lower electrode 26.

The configuration of the upper electrode 27 is not particularly limited, and examples of a material of the upper electrode 27 include the materials exemplified for the lower electrode 26, a material generally used in a semiconductor process, such as Al or Cu, and a combination thereof.

Piezoelectric film (electro-mechanical transducer film) Examples of the configuration of the piezoelectric film 6 include PZT. PZT is a solid solution of lead zirconate ($PbZrO_3$) and titanic acid ($PbTiO_3$), and the characteristics thereof differ depending on a ratio therebetween. In general, as a composition exhibiting excellent piezoelectric characteristics, a ratio between $PbZrO_3$ and $PbTiO_3$ is 53:47, which is indicated by $Pb(Zr_{0.53},Ti_{0.47})O_3$ in a chemical formula, and is indicated by PZT(53/47) in general. Examples of a composite oxide other than PZT include barium titanate. In this case, a barium alkoxide and a titanium alkoxide compound are used as starting materials and dissolved in a common solvent to manufacture a barium titanate precursor solution.

These materials are described by a general formula $ABO_3$, and correspond to composite oxides mainly containing Pb, Ba, or Sr as A and containing Ti, Zr, Sn, Ni, Zn, Mg, or Nb as B. Examples thereof include $(Pb_{1-x},Ba_x)(Zr,Ti)O_3$ and $(Pb_{1-x},Sr_x)(Zr,Ti)O_3$, which are obtained by partially substituting Ba or Sr for Pb at the site A. Such substitution is possible with a divalent element, and an effect thereof is to reduce deterioration of characteristics due to evaporation of lead during a heat treatment. The above materials can be manufactured with a spin coater by a sputtering method or a sol-gel method. In that case, since patterning is required, a desired pattern can be obtained by photolithography etching or the like.

When PZT is manufactured by a sol-gel method, lead acetate, a zirconium alkoxide, or a titanium alkoxide compound is used as a starting material, and dissolved in methoxyethanol as a common solvent to obtain a uniform solution, thus manufacturing a PZT precursor solution. Since the metal alkoxide compound is easily hydrolyzed by moisture in the atmosphere, an appropriate amount of a stabilizer such as acetylacetone, acetic acid, or diethanolamine may be added to the precursor solution as a stabilizer.

When a PZT film is formed on the entire surface of the base substrate, it is preferable to form a coating film by a solution coating method such as spin coating, and to subject the coating film to various heat treatments such as solvent drying, thermal decomposition, and crystallization. Since a transformation from the coating film to a crystallized film involves volume shrinkage, it is preferable to adjust the precursor concentration such that a film thickness of 100 nm or less can be obtained in a single step in order to obtain a crack-free film.

In a case of manufacture by an inkjet method, a patterned film can be obtained by a manufacturing flow similar to that of the lower electrode 26. A surface modifier varies depending on a material of the lower electrode 26 as a base, but a silane compound is mainly selected when an oxide is used as the base, and an alkanethiol is mainly selected when a metal is used as the base.

The film thickness of the piezoelectric film 6 is preferably 0.5 to 5 μm, and more preferably 1 μm to 2 μm. If the thickness is smaller than this range, a sufficient displacement cannot be generated. If the thickness is larger than this range, many layers are laminated, and therefore the number of steps increases to extend process time.

Manufacturing Example of Piezoelectric Thin-Film Element

A method for manufacturing a piezoelectric thin-film element according to the present embodiment is a method for manufacturing a piezoelectric thin-film element including a diaphragm plate on a substrate, a lower electrode on the diaphragm plate, a Pb-containing piezoelectric film on the lower electrode, and an upper electrode on the piezoelectric film. The method includes a diaphragm plate formation step of forming a silicon oxide layer, a silicon nitride layer, and an amorphous layer containing a metal oxide and capable of trapping Pb of the piezoelectric film in this order on the substrate to form the diaphragm plate. The diaphragm plate formation step forms the amorphous layer such that the amorphous layer has such a thickness that Pb of the piezoelectric film does not reach the silicon nitride layer. Although there is a portion overlapping with the above description, the method for manufacturing a piezoelectric thin-film element will be described later together with a specific example of a method for manufacturing a liquid discharge head.

Liquid Discharge Head, Head Module, Liquid Discharge Device, and Liquid Discharge Apparatus A liquid discharge head of the present embodiment will be described. As illustrated in FIGS. 2 and 3, the piezoelectric thin-film element 40 can be used as a part of a liquid discharge head 1 that is a liquid discharge head. Note that the liquid discharge head 1 illustrated in FIG. 2 illustrates an outline of an example of the configuration of a nozzle, and FIG. 3 illustrates an outline of the liquid discharge head 1 formed by arranging a plurality of elements illustrated in FIG. 2.

In addition to the piezoelectric thin-film element 40 that functions as a drive source, the liquid discharge head 1 includes the substrate 2 formed by etching, the pressure chamber 21 as a pressurizing chamber that is an ink chamber that stores ink, and a nozzle plate 10 as an ink nozzle including a nozzle 11 that is a nozzle hole as an ink discharge port that discharges ink in the pressure chamber 21 in the shape of a droplet.

Note that the substrate 2 may be etched to form a cavity serving as the pressure chamber 21, and a diaphragm plate may be disposed on the cavity so as to be bridged between the substrates.

The liquid discharge head 1 discharges liquid such as ink from the nozzle 11 when the piezoelectric thin-film element 40 is driven. Specifically, the liquid discharge head 1 generates a stress in the piezoelectric film 6 by power supply to the lower electrode 26 and the upper electrode 27, thereby vibrates the diaphragm plate 31, and discharges liquid (for example, ink) in the pressure chamber 21 in the shape of a droplet through the nozzle 11 due to the vibration. The piezoelectric thin-film element 40 can be formed by a simple manufacturing step, has performance equivalent to that of bulk ceramics. In addition, etching is removed from a back surface of the piezoelectric thin-film element 40 for forming the pressure chamber 21 thereafter, and the nozzle plate 10 having the nozzle 11 is bonded to the piezoelectric thin-film element 40 to manufacture the liquid discharge head 1.

Figure 7:
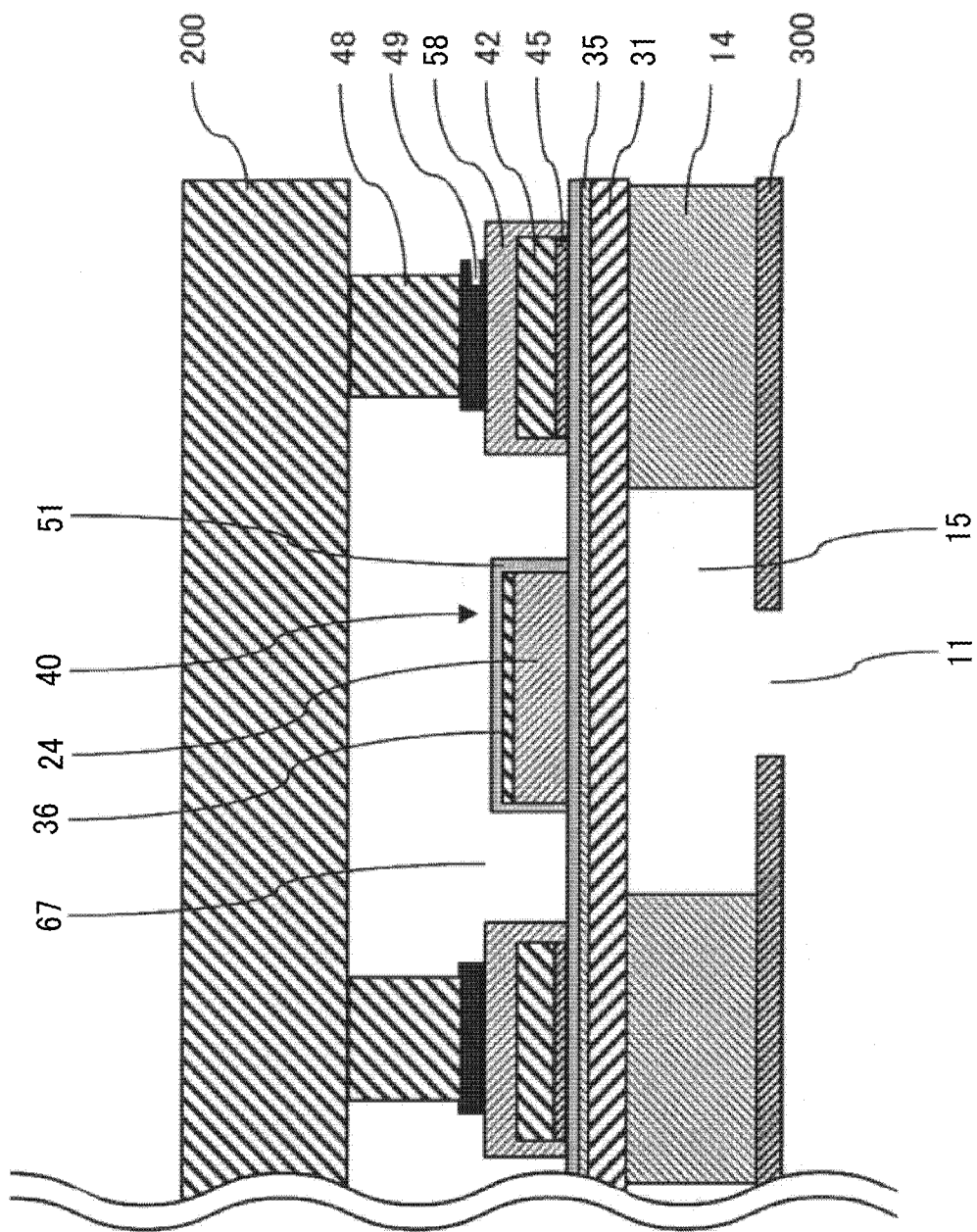
FIG. 7 is a schematic cross-sectional view illustrating an example of a liquid discharge head according to an embodiment of the present disclosure in a short direction of a liquid chamber.
Figure 8:
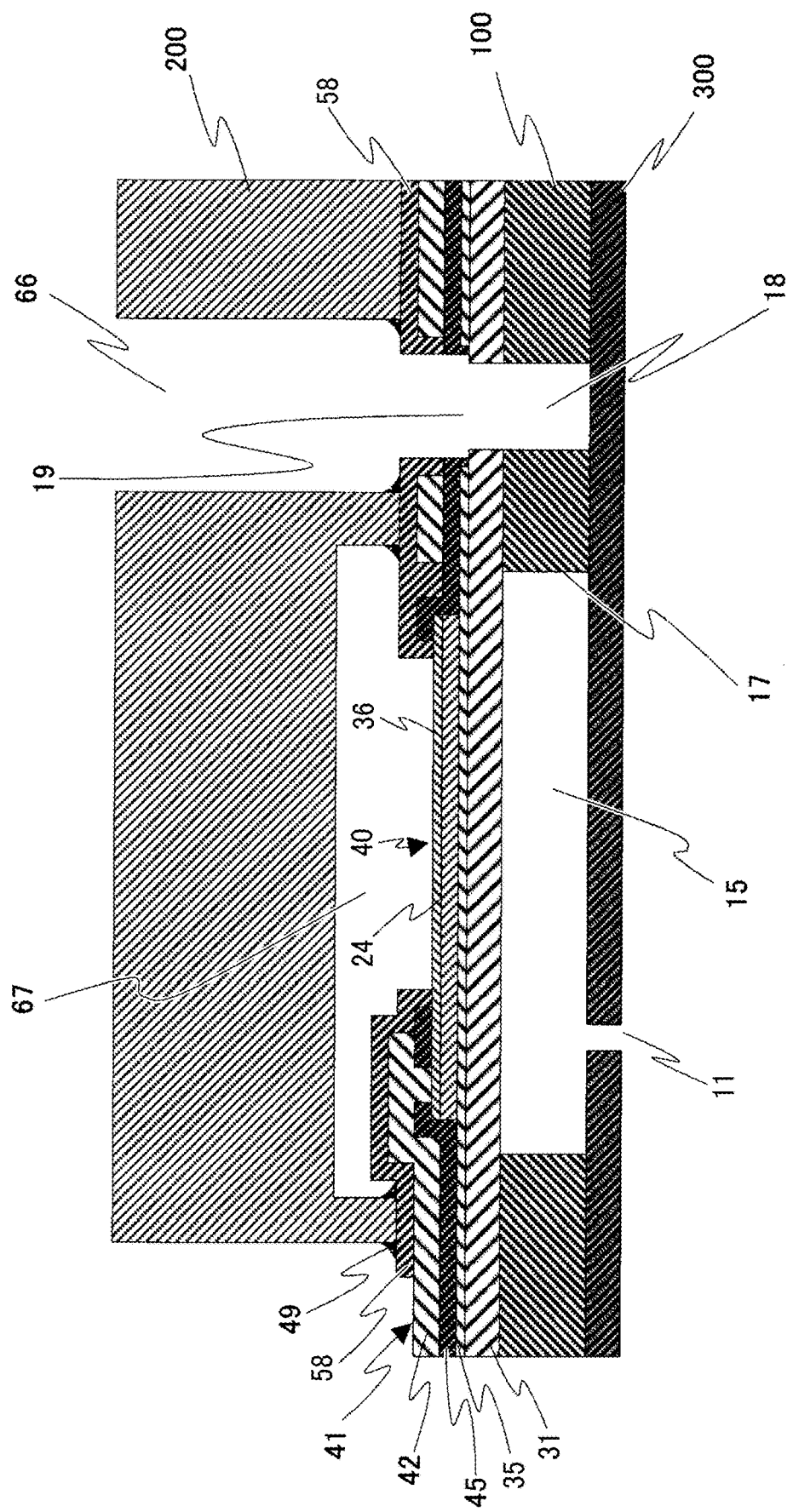
FIG. 8 is a schematic cross-sectional view illustrating an example of a liquid discharge head according to an embodiment of the present disclosure in a longitudinal direction of a liquid chamber.

Next, another form of the liquid discharge head will be described. FIG. 7 is a schematic cross-sectional view of the pressurizing liquid chamber 15 of a liquid discharge head according to an embodiment of the present disclosure in a short direction thereof. FIG. 8 is a schematic cross-sectional view of the pressurizing liquid chamber 15 in the embodiment in a longitudinal direction thereof.

As illustrated in FIGS. 7 and 8, the liquid discharge head according to the present embodiment forms a common liquid chamber 18, the pressurizing liquid chamber 15, the diaphragm plate 31, and the piezoelectric element 40 that generates energy for discharging liquid in an actuator substrate 100. The pressurizing liquid chambers 15 communicating with the common liquid chamber 18 are separated from each other by a pressurizing liquid chamber partition wall 14.

In the piezoelectric element 40, an electro-mechanical transducer film 24 is sandwiched between a common electrode 35 and an individual electrode 36, and a wiring layer 42 (lead-out wiring) is laminated on each of the electrode layers to apply a voltage. One side of the pressurizing liquid chamber 15 is covered with the diaphragm plate 31, and the other side thereof is covered with a nozzle substrate 300 to form the pressurizing liquid chamber 15. The actuator substrate 100, a support substrate 200, and the nozzle substrate 300 are bonded to each other to form a liquid discharge head.

In the liquid discharge head formed in this way, each of the pressurizing liquid chambers 15 is filled with liquid, for example, recording liquid (ink), and a pulse voltage of, for example, 20V is applied to the individual electrode 36 corresponding to the nozzle 11 that performs discharge on the basis of image data from a control unit by an oscillation circuit via lead-out wiring and a connection hole in an interlayer insulating film. By applying this voltage pulse, the piezoelectric element 40 itself is contracted in a direction parallel to the diaphragm plate 31 due to an electrostrictive effect, and the diaphragm plate 31 bends in a direction of the pressurizing liquid chamber 15.

As a result, the pressure in the pressurizing liquid chamber 15 rapidly rises, and a recording liquid is discharged from the nozzle 11 communicating with the pressurizing liquid chamber 15. Next, after application of the pulse voltage, the contracted piezoelectric element 40 returns to its original form, and therefore the bent diaphragm plate 31 returns to its original position. For this reason, the pressure in the pressurizing liquid chamber 15 is more negative than that in the common liquid chamber 18, and ink supplied from the outside via a liquid supply port 66 is supplied to the pressurizing liquid chamber 15 from the common liquid supply passage 19 and the common liquid chamber 18 via a fluid resistance portion 17. By repeating this, the liquid can be continuously discharged, and an image is formed on a recording medium (sheet of paper) disposed opposing to the liquid discharge head.

Next, a method for manufacturing the liquid discharge head of the present embodiment will be described with specific examples.

As the actuator substrate 100, a diaphragm plate is formed on a silicon single crystal substrate (for example, a plate thickness: 400 µm) having a plane orientation (110). This diaphragm plate is a laminate obtained by laminating three layers of a silicon oxide film, a silicon nitride film, and an amorphous layer as materials by an LP-CVD method.

The amorphous layer is preferably a silicon oxide film or an aluminum oxide film, but is not limited to the above film types as long as being able to trap Pb contained in PZT formed thereabove. However, the amorphous layer desirably has a film thickness of 40 nm or more in order to reliably prevent diffusion of Pb.

Thereafter, for example, an adhesion layer containing $TiO_2$ and a lower electrode containing Pt are formed by a sputtering method so as to have thicknesses of 20 nm and 160 nm, respectively.

Next, a film of PZT is formed as the piezoelectric element 40 on the common electrode 35 in a plurality of times, for example, by a spin coating method, and finally a film of PZT having a thickness of 2 µm is formed.

Here, the film formation method of the piezoelectric element 40 is not limited to the spin coating method, and for example, a sputtering method, an ion plating method, an air sol method, a sol gel method, or an inkjet method may be used.

Next, as the upper electrode 27 containing SRO and Pt, a film having a thicknesses of nm and a film having a thicknesses of 100 nm are formed by a sputtering method.

Next, the piezoelectric element 40 and the individual electrode 36 are formed at a position corresponding to the pressurizing liquid chamber 15 to be formed later by a litho-etch method. The piezoelectric element 40 is formed at a position corresponding to a bonding portion 48.

Next, an interlayer insulating film 45 is formed in order to insulate the common electrode 35 and the piezoelectric element 40 from the lead-out wiring 42 to be formed later.

As the interlayer insulating film 45, for example, an $SiO_2$ film having a thickness of 1000 nm is formed by a plasma CVD method. The interlayer insulating film may contain a material other than $SiO_2$ in the plasma CVD method as long as the interlayer insulating film does not affect the piezoelectric element 40 or an electrode material and has an insulating property. Next, a connection hole coupling the individual electrode 36 to the lead-out wiring 42 is formed by a litho-etch method. When the common electrode 35 is also coupled to the lead-out wiring 42, a connection hole is similarly formed.

Next, as the lead-out wiring 42, for example, a film of TiN and a film of Al are formed by a sputtering method so as to have film thicknesses of 30 nm and 3 µm, respectively. Pt which is a material of the individual electrode 36 or the common electrode 35 is directly in contact with Al which is a material of the lead-out wiring 42 at a bottom of the connection hole. Pt is thereby alloyed with Al by a heat history in a subsequent step. In order to prevent film peeling or the like due to a stress by a change in volume, TiN is used as a barrier layer 51 that prevents alloying. The wiring layer 42 is also formed at a location that becomes a bonding portion 49 with the support substrate 200 later.

Next, as a passivation film 58, a silicon nitride film is formed so as to have a thickness of 1000 nm by, for example, a plasma CVD method.

Next, a lead-out wiring pad portion 41 of the lead-out wiring 42, an actuator portion 68, and the common liquid supply passage 19 are opened by a litho-etch method.

Next, the diaphragm plate 31 is removed at alocation that becomes the common liquid supply passage 19 and the common liquid chamber 18 portion later by the litho-etch method.

Next, a counterbore 67 is formed at a position corresponding to the actuator portion 68 by the litho-etch method to form a main flow liquid chamber 68 and a tributary liquid chamber 66. Furthermore, the support substrate 200 in which a round portion 70 is formed on a side wall of the tributary liquid chamber 66 is manufactured. At this time, Si processing is performed by dry etching.

Thereafter, the support substrate 200 and the actuator substrate 100 are bonded to each other with an adhesive via a bonding portion 47 and the bonding portion 48. At this time, the adhesive is applied to a side of the support substrate 200 with a thickness of about 1 µm by a general thin film transfer apparatus.

Thereafter, in order to form the pressurizing liquid chamber 15, the common liquid chamber 18, and the fluid resistance portion 17, the actuator substrate 100 is polished by a known technique so as to have a desired thickness t (for example, a thickness of 80 µm). Etching or the like may be used in addition to the polishing method.

Next, partition walls other than the pressurizing liquid chamber 15, the common liquid chamber 18, and the fluid resistance portion 17 are coated with a resist by a litho method. Thereafter, anisotropic wet etching is performed with an alkaline solution (KOH solution or tetramethylammonium hydroxide (TMAH) solution) to form the pressurizing liquid chamber 15, the common liquid chamber 18, and the fluid resistance portion 17. The pressurizing liquid chamber 15, the common liquid chamber 18, and the fluid resistance portion 17 may be formed by dry etching using an inductively coupled plasma (ICP) etcher in addition to anisotropic etching with an alkaline solution.

Next, the nozzle substrate 300 having the nozzles (nozzle holes) 16 opened are bonded to positions corresponding to the separately formed pressurizing liquid chambers 15 to complete a liquid discharge head.

Figure 9:
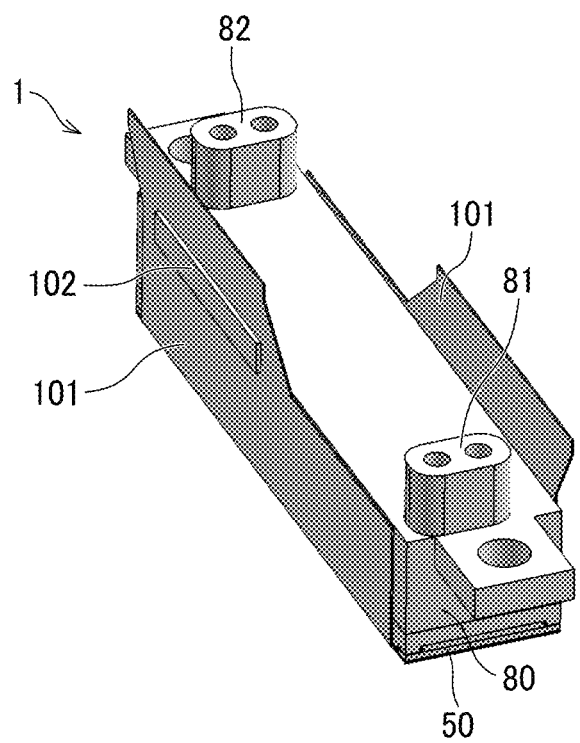
FIG. 9 is an external perspective explanatory view of a liquid discharge head according to another embodiment of the present disclosure.
Figure 10:
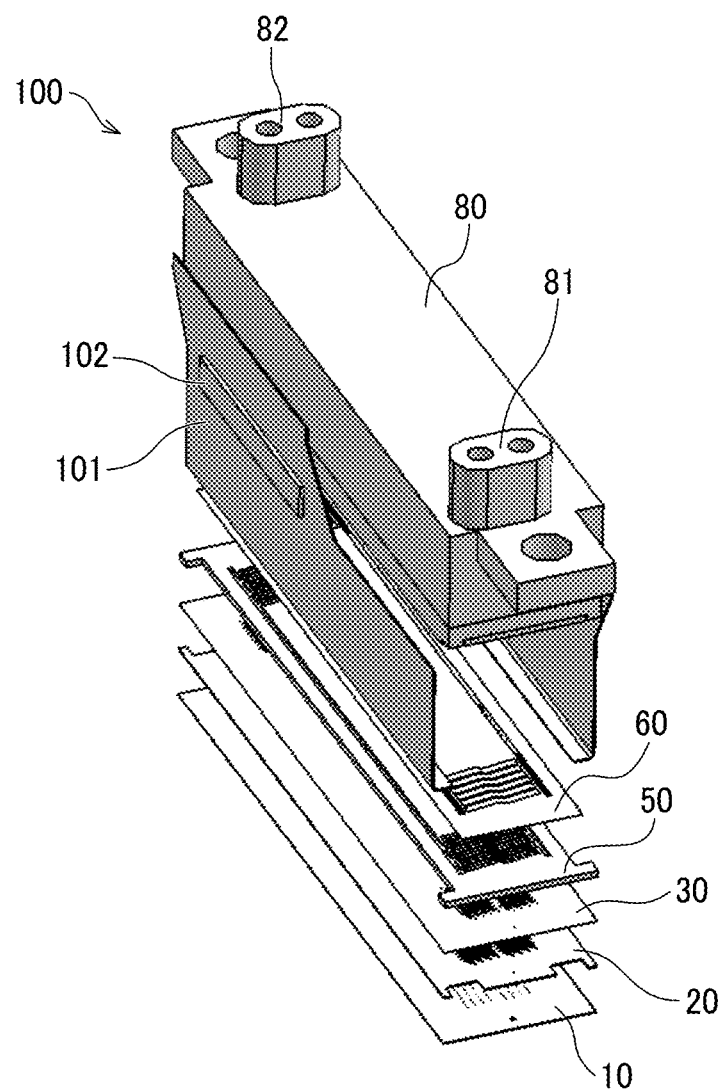
FIG. 10 is an exploded perspective explanatory view of the liquid discharge head.
Figure 11:
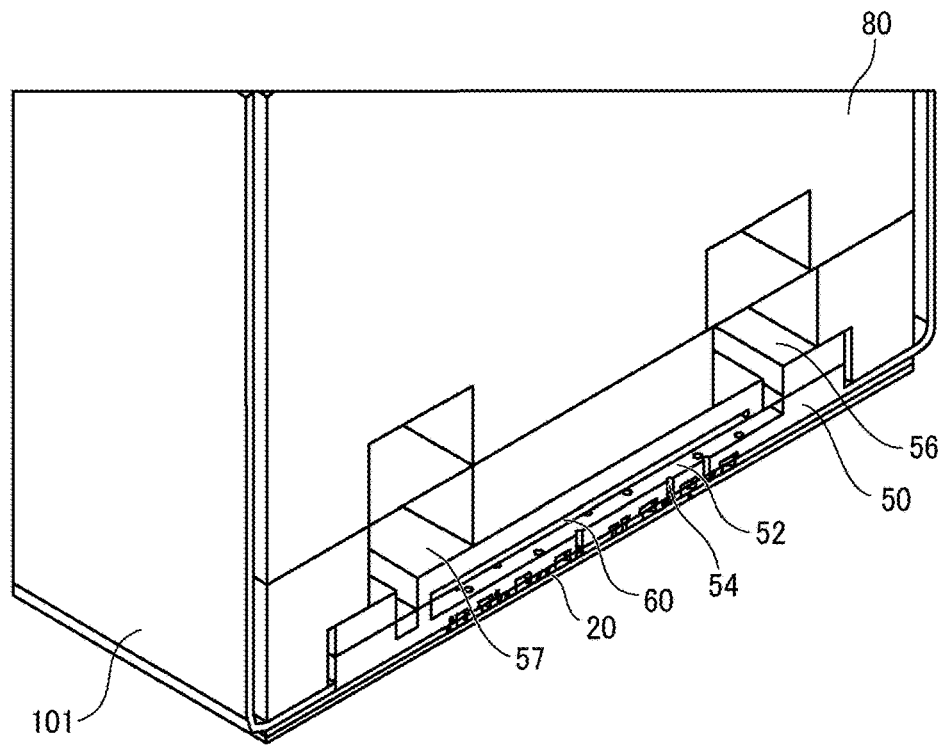
FIG. 11 is a cross-sectional perspective explanatory view of the liquid discharge head.
Figure 12:
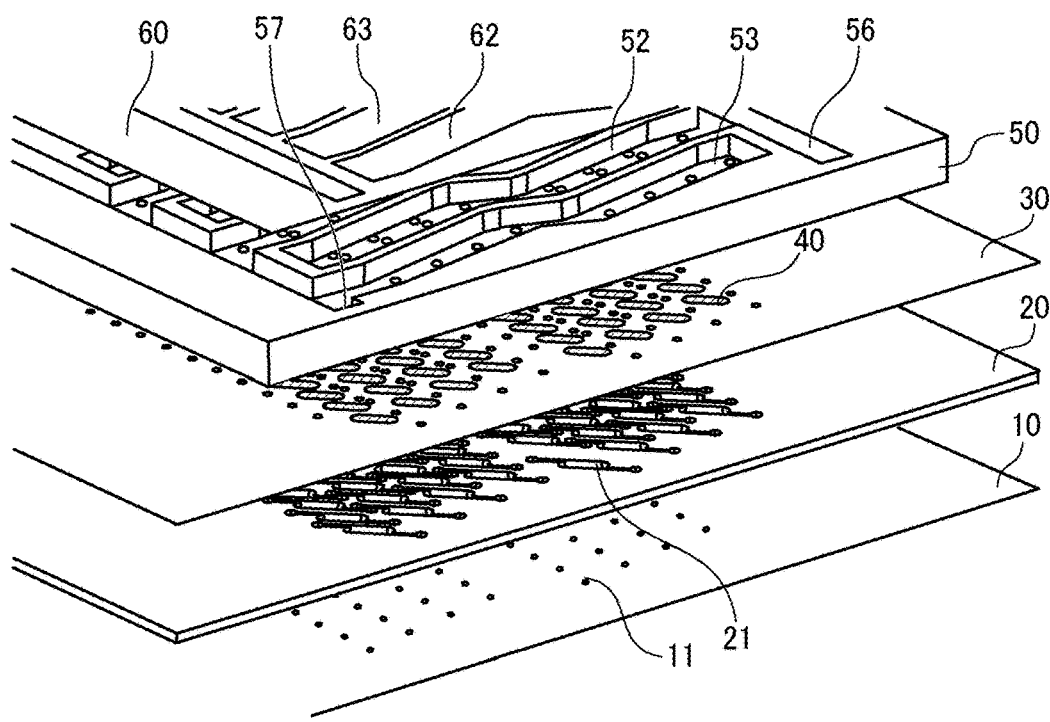
FIG. 12 is an exploded perspective explanatory view of the liquid discharge head, excluding a frame member.
Figure 13:
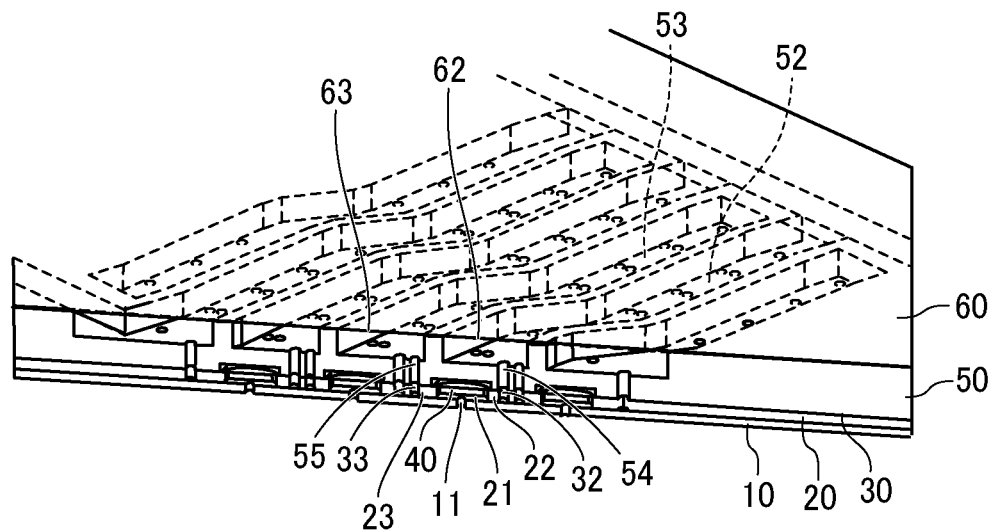
FIG. 13 is a cross-sectional perspective explanatory view of a channel portion of the liquid discharge head.
Figure 14:
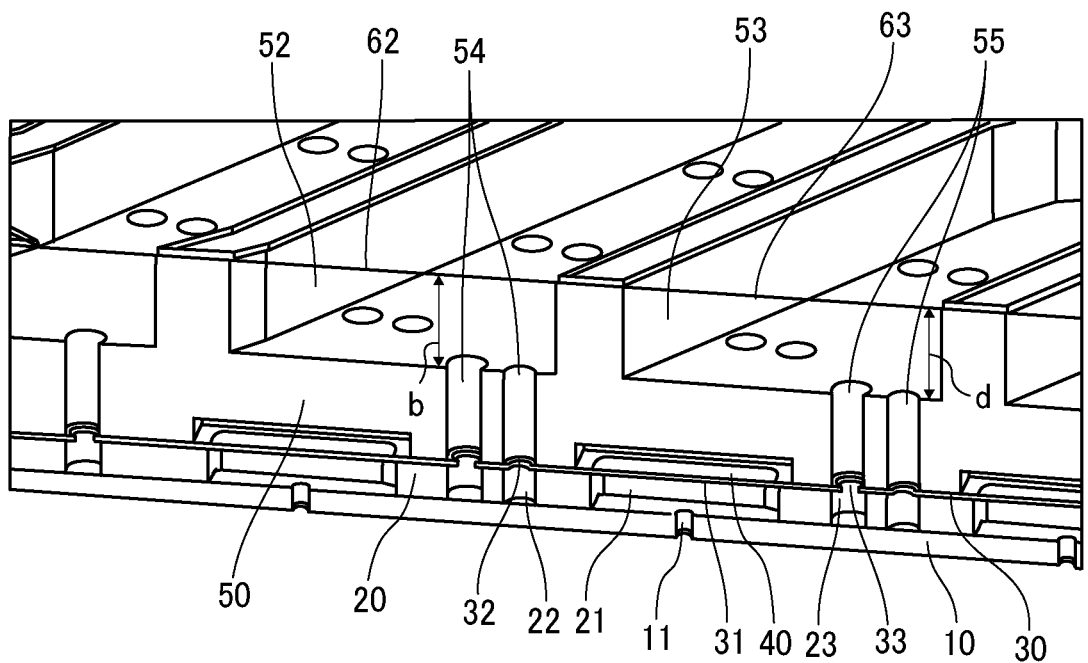
FIG. 14 is an enlarged cross-sectional perspective explanatory view of a channel portion of the liquid discharge head.
Figure 15:
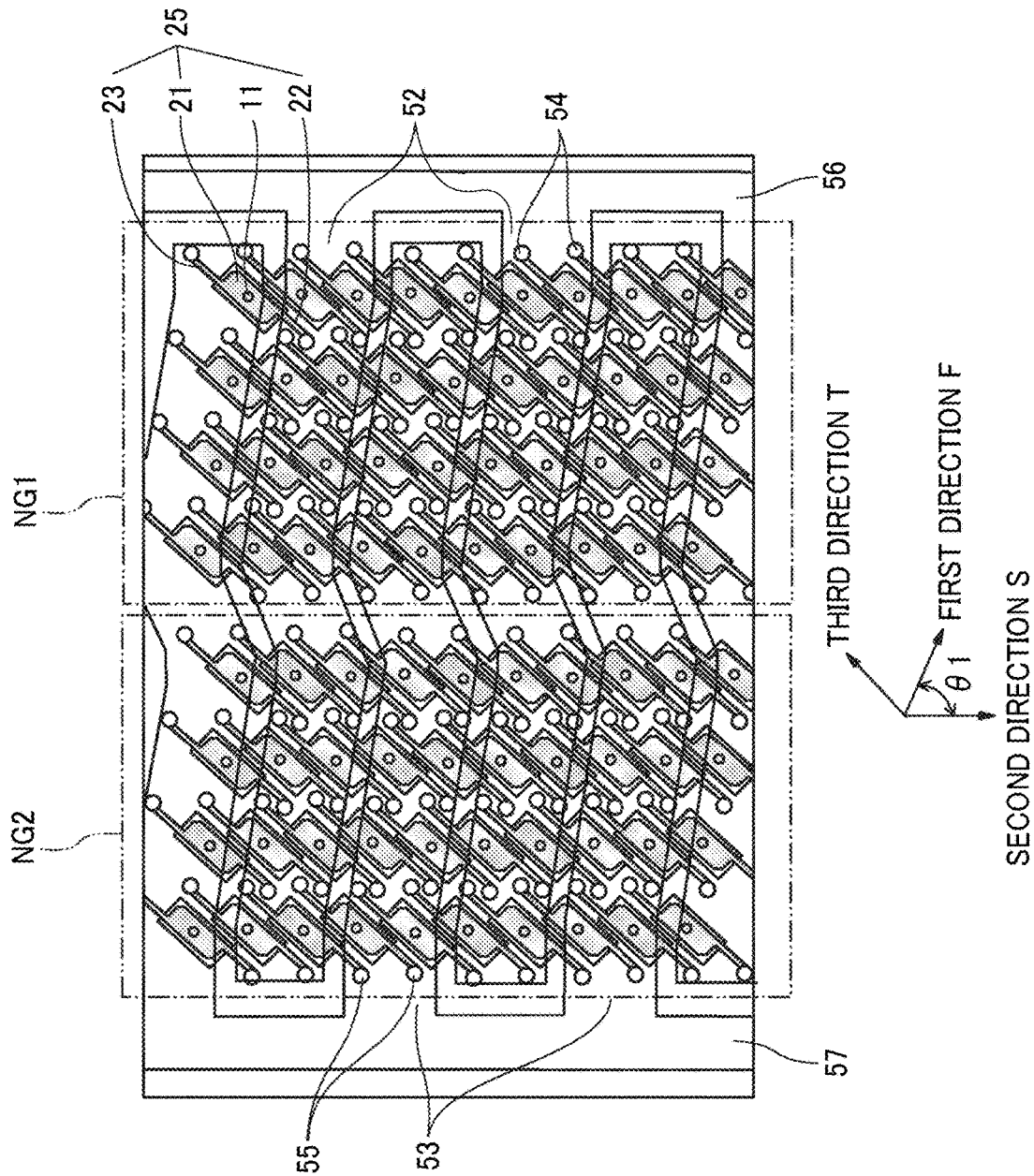
FIG. 15 is a plan explanatory view of a channel portion of the liquid discharge head.

Next, another form of the liquid discharge head will be described. The present embodiment will be described with reference to FIGS. 9 to 15. FIG. 9 is a perspective explanatory view of an external appearance of a liquid discharge head according to the present embodiment. FIG. 10 is an exploded perspective explanatory view of the liquid discharge head. FIG. 11 is a cross-sectional perspective explanatory view of the liquid discharge head. FIG. 12 is an exploded perspective explanatory view of the liquid discharge head, excluding a frame member. FIG. 13 is a cross-sectional perspective explanatory view of a channel portion of the liquid discharge head. FIG. 14 is an enlarged cross-sectional perspective explanatory view of a channel portion of the liquid discharge head. FIG. 15 is a plan explanatory view of a channel portion of the liquid discharge head.

A liquid discharge head 1 includes a nozzle plate 10, a channel plate (individual channel member) 20, a diaphragm member 30, a common channel member 50, a damper member 60, a frame member 80, a board (flexible wiring board) 101 on which a drive circuit 102 is mounted, and the like.

The nozzle plate 10 includes a plurality of nozzles 11 that discharges liquid. The plurality of nozzles 11 is two-dimensionally arranged in a matrix and arranged in three directions of a first direction F, a second direction S, and a third direction T as illustrated in FIG. 15.

The individual channel member 20 forms a plurality of pressure chambers (individual liquid chambers) 21 respectively communicating with the plurality of nozzles 11, a plurality of individual supply channels 22 respectively communicating with the plurality of pressure chambers 21, and a plurality of individual collection channels 23 respectively communicating with the plurality of pressure chambers 21. One of the pressure chambers 21, one of the individual supply channels 22 communicating with the pressure chamber 21, and one of the individual collection channels 23 communicating with the pressure chamber 21 are collectively referred to as an individual channel 25.

The diaphragm member 30 forms a diaphragm plate 31 which is a deformable wall surface of the pressure chamber 21, and a piezoelectric element 40 is integrally disposed on the diaphragm plate 31. On the diaphragm member 30, a supply side opening 32 communicating with the individual supply channel 22 and a collection side opening 33 communicating with the individual collection channel 23 are formed. The piezoelectric element 40 is a pressure generator that deforms the diaphragm plate 31 to pressurize liquid in the pressure chamber 21.

Note that the individual channel member 20 and the diaphragm member 30 are not limited to being separate members as members. For example, the individual channel member 20 and the diaphragm member 30 can be formed integrally with the same member using a silicon on insulator (SOI) substrate. That is, an SOI substrate formed on a silicon substrate in order of a silicon oxide film, a silicon layer, and a silicon oxide film is used, the silicon substrate is used as the individual channel member 20, and the silicon oxide film, the silicon layer, and the silicon oxide film can form the diaphragm plate 31. In this configuration, the layer configuration of the silicon oxide film, the silicon layer, and the silicon oxide film in the SOI substrate serves as the diaphragm member 30. As described above, the diaphragm member 30 includes a member containing a film-shaped material on a surface of the individual channel member 20.

The common channel member 50 forms a plurality of common supply channel branches 52 communicating with two or more of the individual supply channels 22 and a plurality of common collection channel branches 53 communicating with two or more of the individual collection channels 23 alternately so as to be adjacent to each other in the second direction S of the nozzles 11.

In the common channel member 50, a through hole serving as a supply port 54 for communicating the supply side opening 32 of the individual supply channel 22 with the common supply channel branch 52 and a through hole serving as a collection port 55 for communicating the collection side opening 33 of the individual collection channel 23 with the common collection channel branch 53 are formed.

The common channel member 50 forms one or more common supply channel mainstreams 56 communicating with the plurality of common supply channel branches 52 and one or more common collection channel mainstreams 57 communicating with the plurality of common collection channel branches 53.

The damper member 60 includes a supply side damper 62 facing (opposing to) the supply port 54 of the common supply channel branch 52 and a collection side damper 63 facing (opposing to) the collection port 55 of the common collection channel branch 53.

Here, the common supply channel branch 52 and the common collection channel branch 53 are alternately arranged in the same common channel member 50 to form grooves, and the grooves are sealed with the supply side damper 62 or the collection side damper 63 of the damper member 60. Note that a damper material of the damper member 60 is preferably a metal thin film or an inorganic thin film resistant to an organic solvent. The thickness of the damper member 60 in a portion of the supply side damper 62 or the collection side damper 63 is preferably 10 μm or less.

Figure 16:
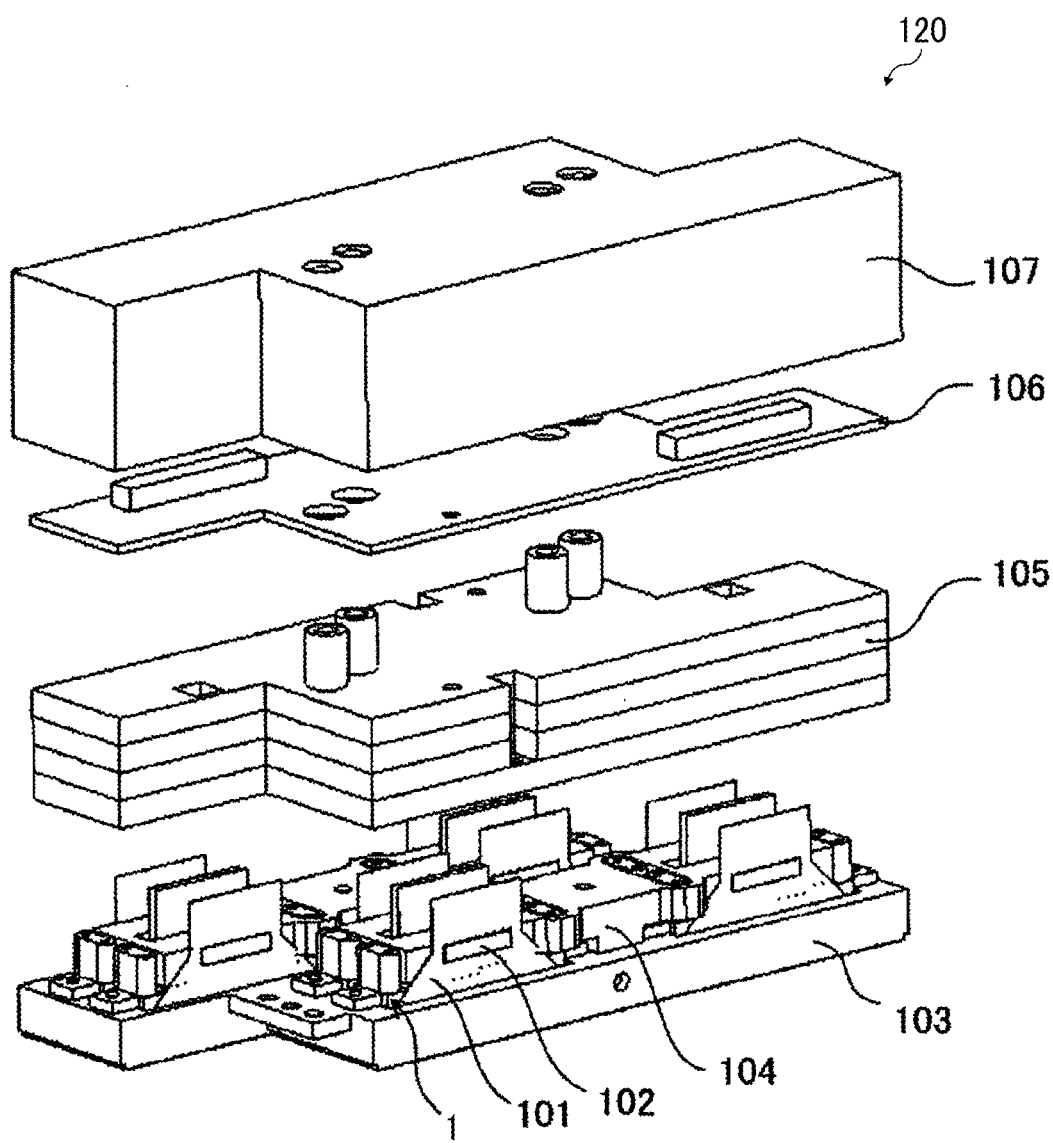
FIG. 16 is an exploded perspective explanatory view of an example of a head module according to an embodiment of the present disclosure.
Figure 17:
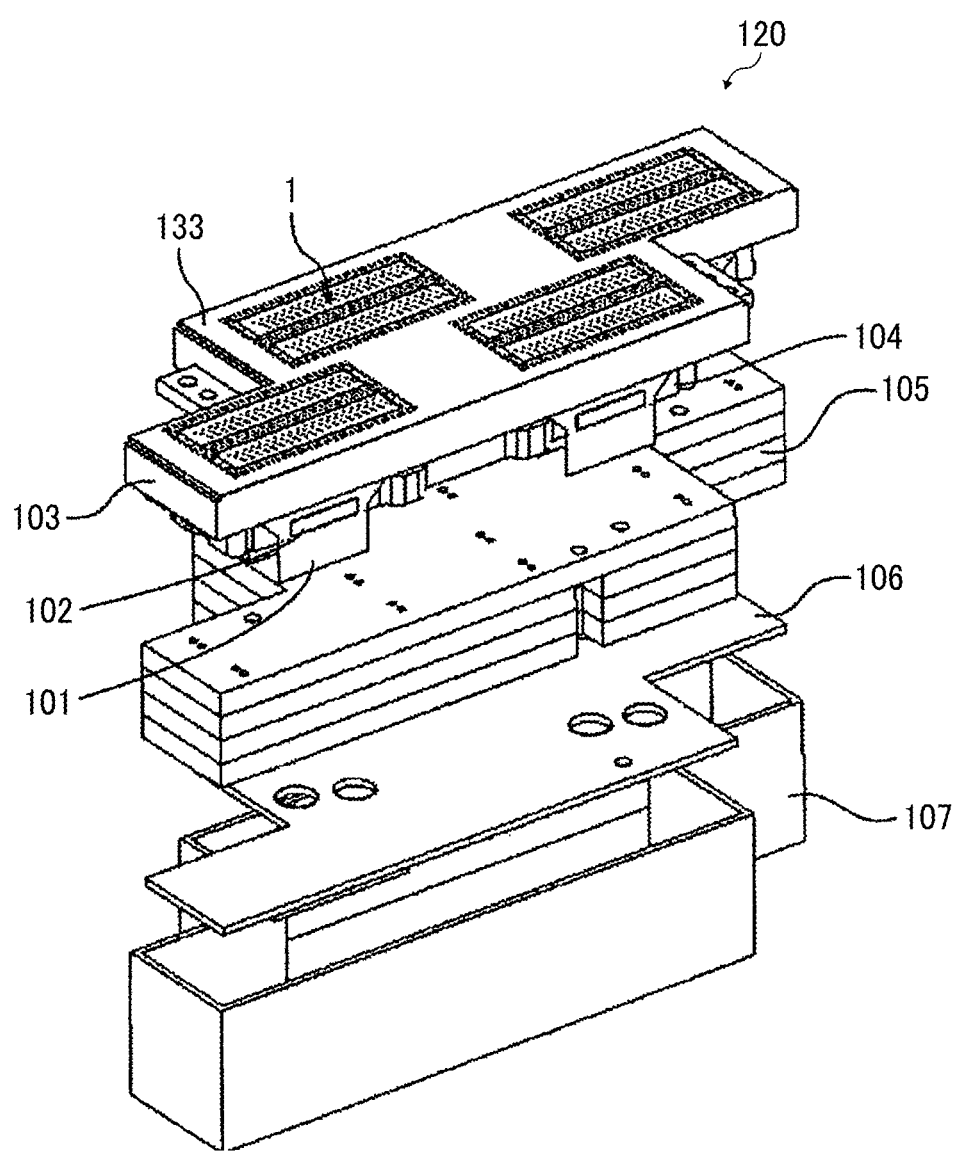
FIG. 17 is an exploded perspective explanatory view of the head module as viewed from a side of a nozzle surface.

Next, an example of the head module according to an embodiment of the present disclosure will be described with reference to FIGS. 16 and 17. FIG. 16 is an exploded perspective explanatory view of the head module. FIG. 17 is an exploded perspective explanatory view of the head module as viewed from a side of a nozzle surface.

A head module 120 includes a plurality of liquid discharge heads 1 as a liquid discharger to discharge liquid, a base member 103 holding the plurality of liquid discharge heads 1, and a cover member 133 that is a nozzle cover of the plurality of liquid discharge heads 1.

The head module 120 further includes a heat radiation member 104, a manifold 105 forming a channel for supplying liquid to the plurality of liquid discharge heads, a printed circuit board (PCB) 106 coupled to the flexible wiring board 101, and a module case 107.

Figure 18:
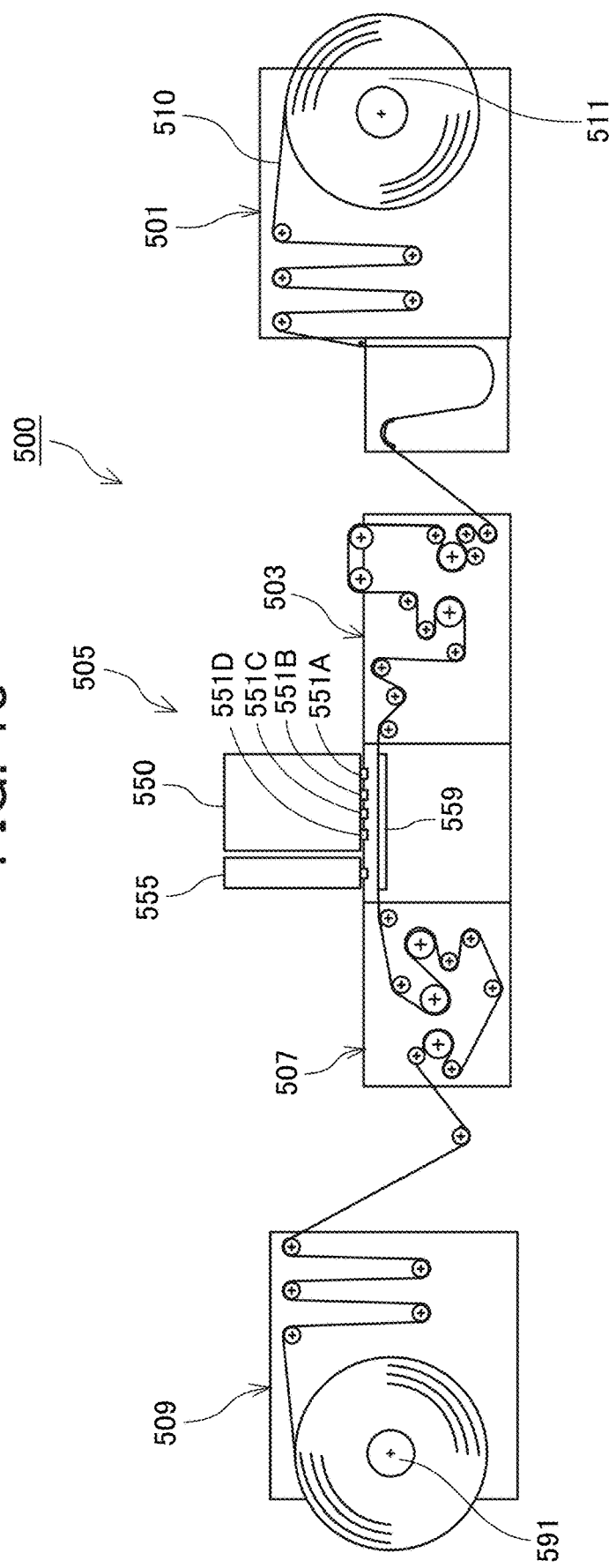
FIG. 18 is a schematic explanatory view of an example of a liquid discharge apparatus according to an embodiment of the present disclosure.

Next, an example of a liquid discharge apparatus according to an embodiment of the present disclosure will be described with reference to FIG. 18. FIG. 18 is a schematic explanatory view of the apparatus.

A printing apparatus 500 that is the liquid discharge apparatus includes a carry-in unit 501 for carrying a continuous body 510 in, a guiding and conveying unit 503 for guiding and conveying the continuous body 510 carried in from the carry-in unit 501 to a printer 505, the printer 505 for discharging liquid onto the continuous body 510 and performing printing to form an image, a dryer 507 for drying the continuous body 510, a carry-out unit 509 for carrying the continuous body 510 out, and the like.

The continuous body 510 is fed out from an original winding roller 511 of the carry-in unit 501, guided and conveyed by each roller of the carry-in unit 501, the guiding and conveying unit 503, the dryer 507, and the carry-out unit 509, and wound by a winding roller 591 of the carry-out unit 509.

In the printer 505, the continuous body 510 is conveyed on a conveying guide member 559 opposing to a head unit 550, and an image is printed by liquid discharged from the head unit 550. Note that the head unit is an embodiment of the liquid discharge device.

Figure 19:
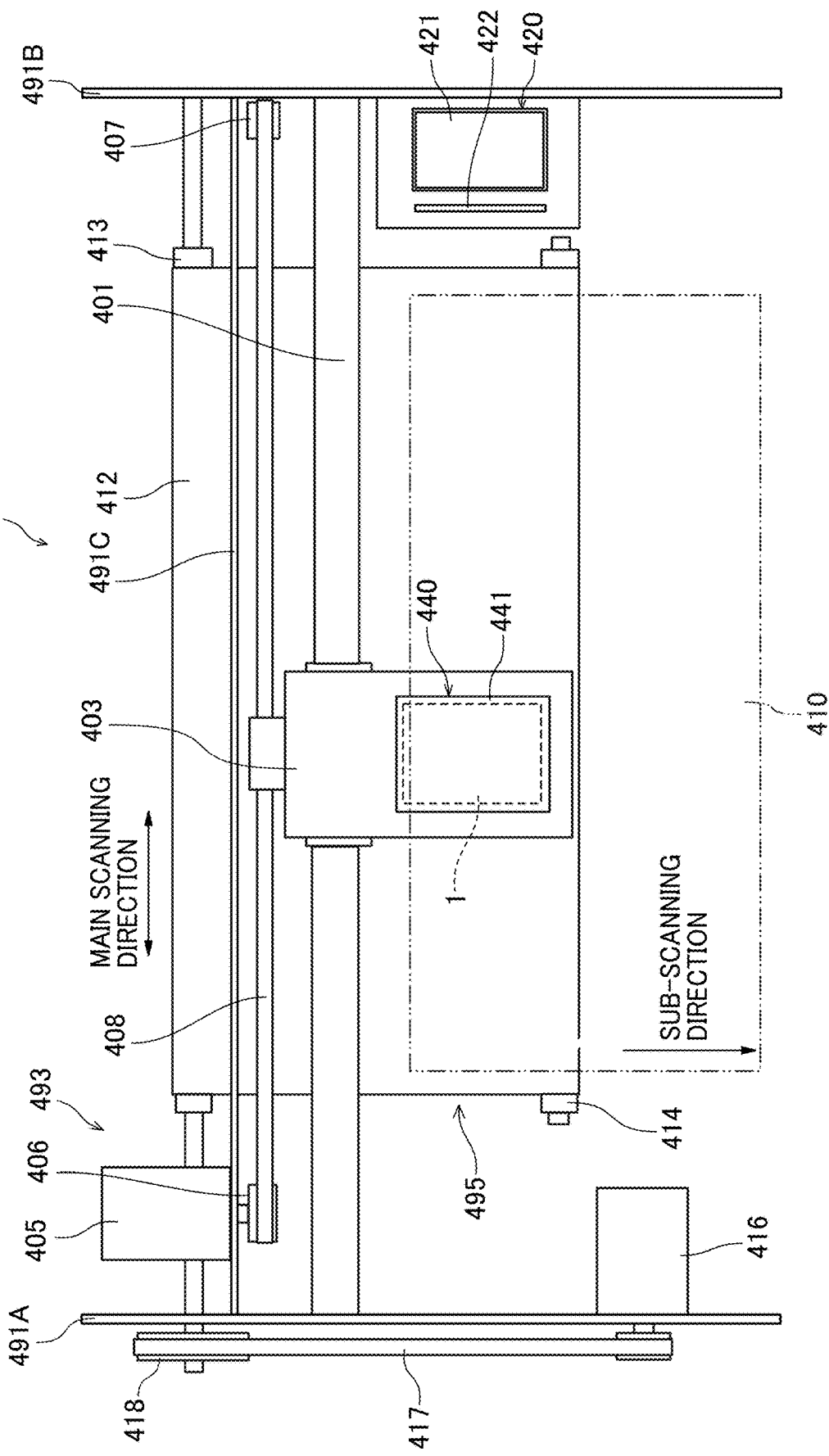
FIG. 19 is a plan explanatory view of a main part of another example of a printing apparatus as a liquid discharge apparatus according to an embodiment of the present disclosure.
Figure 20:
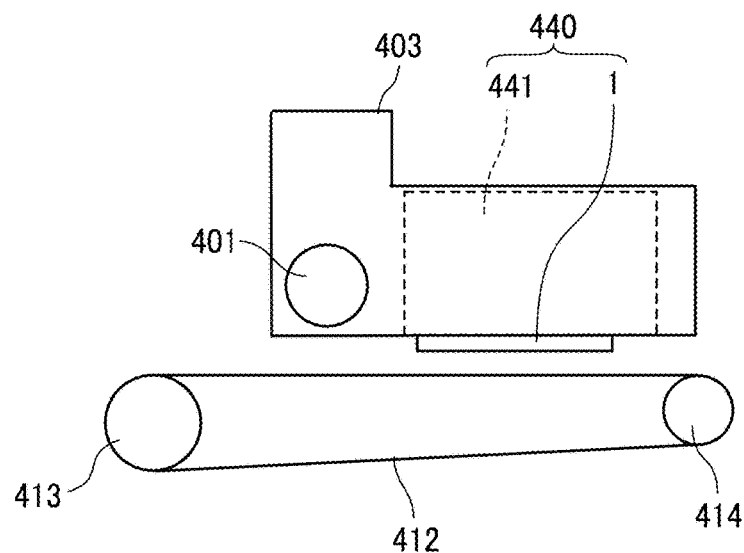
FIG. 20 is a side explanatory view of a main part of the printing apparatus.

Next, another example of the printing apparatus as the liquid discharge apparatus according to an embodiment of the present disclosure will be described with reference to FIGS. 19 and 20. FIG. 19 is a plan explanatory view of a main part of the apparatus. FIG. is a side explanatory view of a main part of the apparatus.

This printing apparatus 500 is a serial type apparatus, and a carriage 403 reciprocates in a main scanning direction by a main scanning movement mechanism 493. The main scanning movement mechanism 493 includes a guide member 401, a main scanning motor 405, a timing belt 408, and the like. The guide member 401 is stretched between left and right side plates 491A and 491B to movably hold the carriage 403. The main scanning motor 405 reciprocates the carriage 403 in the main scanning direction via the timing belt 408 stretched between a driving roller 406 and a driven roller 407.

The carriage 403 has a liquid discharge device 440 formed by integrating the liquid discharge head 1 that is the liquid discharge head according to an embodiment of the present disclosure with a head tank 441 mounted thereon. The liquid discharge head 1 of the liquid discharge device 440 discharges liquid of colors of, for example, yellow (Y), cyan (C), magenta (M), and black (K). The liquid discharge head 1 arranges nozzle rows including a plurality of nozzles in a sub-scanning direction orthogonal to the main scanning direction with a discharge direction downward.

The liquid discharge head 1 is coupled to a liquid circulation device, and liquid of a required color may be circulated and supplied.

The printing apparatus 500 includes a conveyance mechanism 495 for conveying a sheet 410. The conveyance mechanism 495 includes a conveyance belt 412 as a conveyer and a sub-scanning motor 416 for driving the conveyance belt 412.

The conveyance belt 412 attracts the sheet 410 and conveys the sheet 410 at a position opposing to the liquid discharge head 1. The conveyance belt 412 is an endless belt, and is bridged between a conveyance roller 413 and a tension roller 414. Attraction can be performed by electrostatic attraction, air suction, or the like.

The conveyance belt 412 is rotated in the sub-scanning direction by rotation of the conveyance roller 413 via the timing belt 417 and the timing pulley 418 by the sub-scanning motor 416.

Furthermore, on one side of the carriage 403 in the main scanning direction, a maintenance recovery device 420 that maintains and recovers the liquid discharge head 1 is disposed on a side of the conveyance belt 412.

The maintenance recovery device 420 includes, for example, a cap 421 that caps a nozzle surface of the liquid discharge head 1 and a wiper 422 that wipes the nozzle surface.

The main scanning movement mechanism 493, the maintenance recovery device 420, and the conveyance mechanism 495 are attached to a housing including the side plates 491A and 491B and a back plate 491C.

In the printing apparatus 500 having such a configuration, the sheet 410 is fed onto the conveyance belt 412, attracted, and conveyed in the sub-scanning direction by rotation of the conveyance belt 412.

Therefore, the liquid discharge head 1 is driven in accordance with an image signal while the carriage 403 is moved in the main scanning direction to discharge liquid onto the sheet 410 being stopped, thus forming an image.

Figure 21:
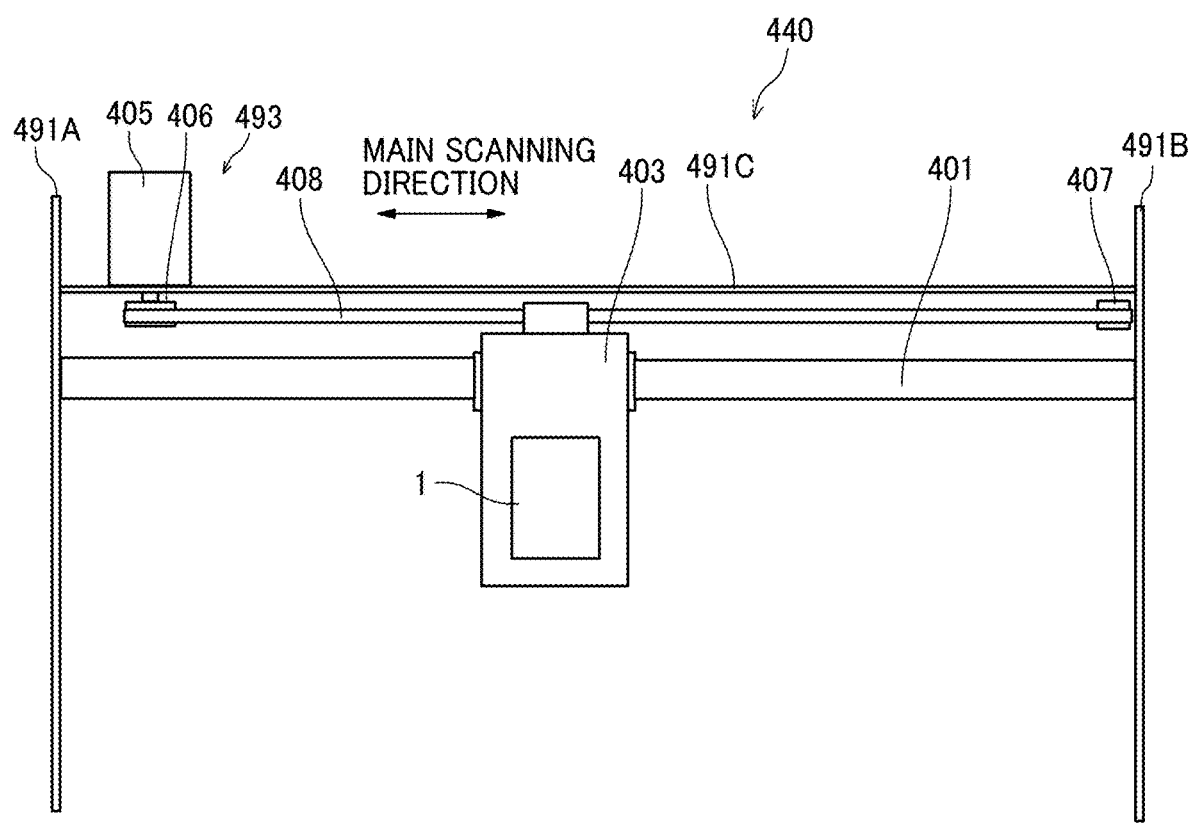
FIG. 21 is a plan explanatory view of a main part of another example of a liquid discharge device according to an embodiment of the present disclosure.

Next, another example of the liquid discharge device according to an embodiment of the present disclosure will be described with reference to FIG. 21. FIG. 21 is a plan explanatory view of a main part of the device.

This liquid discharge device 440 includes a housing portion including the side plates 491A and 491B and the back plate 491C, the main scanning movement mechanism 493, the carriage 403, and the liquid discharge head 1 out of the members constituting the liquid discharge apparatus.

Note that it is also possible to form a liquid discharge device having the above-described maintenance recovery device 420 further attached to, for example, the side plate 491B of this liquid discharge device 440.

Figure 22:
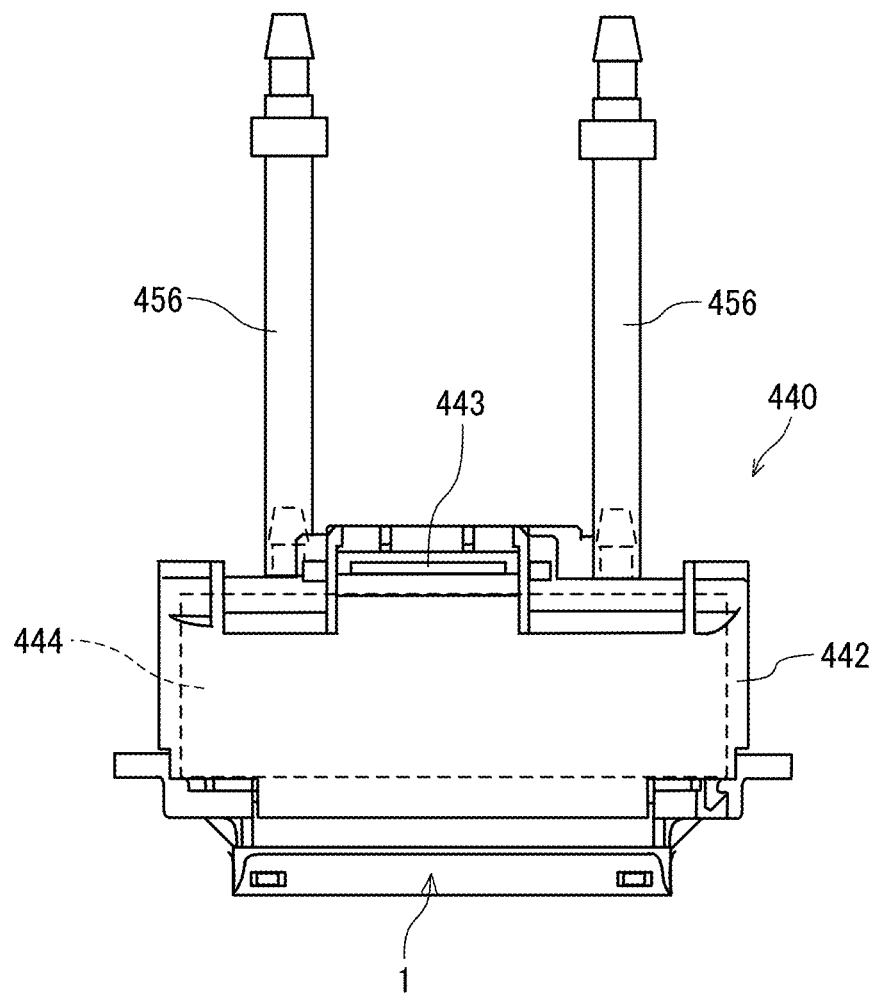
FIG. 22 is a front explanatory view of still another example of a liquid discharge device according to an embodiment of the present disclosure.

Next, still another example of the liquid discharge device according to an embodiment of the present disclosure will be described with reference to FIG. 22. FIG. 22 is a front explanatory view of the device.

This liquid discharge device 440 includes the liquid discharge head 1 having a channel component 444 attached thereto and a tube 456 coupled to the channel component 444.

Note that the channel component 444 is disposed in a cover 442. Instead of the channel component 444, the head tank 441 can be included. A connector 443 that makes electrical connection with the liquid discharge head 1 is disposed on an upper part of the channel component 444.

In the present application, a liquid to be discharged is not particularly limited as long as having viscosity and surface tension that makes it possible to discharge the liquid from a liquid discharge head. However, the liquid preferably has viscosity of 30 mPa·s or less at ordinary temperature and ordinary pressure or by heating and cooling. More specifically, the liquid to be discharged is a solution, a suspension liquid, an emulsion, or the like containing a solvent such as water or an organic solvent, a colorant such as a dye or a pigment, a function-imparting material such as a polymerizable compound, a resin, or a surfactant, a biocompatible material such as deoxyribonucleic acid (DNA), amino acid, protein, or calcium, or an edible material such as a natural pigment, which can be used, for example, for an inkjet ink, a surface treatment liquid, a liquid for forming a constituent element of an electronic element or a light emitting element or an electronic circuit resist pattern, a three-dimensional modeling material liquid, or the like.

Examples of an energy generating source for discharging liquid include those using a piezoelectric actuator (laminated piezoelectric element and thin film piezoelectric element), a thermal actuator using an electrothermal transducer such as a heat generating resistor, and an electrostatic actuator including a diaphragm plate and a counter electrode.

The "liquid discharge device" is formed by integrating a functional component and a mechanism with a liquid discharge head, and includes an assembly of components related to discharge of liquid. Examples of the "liquid discharge device" include a device formed by combining at least one of configurations of a head tank, a carriage, a supply mechanism, a maintenance recovery device, a main scanning movement mechanism, and a liquid circulation device with a liquid discharge head.

Here, examples of the integration include a form in which a liquid discharge head, a functional component, and a mechanism are secured to each other by fastening, bonding, engagement, or the like, and a form in which one is held movably with respect to the other.

A liquid discharge head, a functional component, and a mechanism may be detachable from each other.

Examples of the liquid discharge device include a device in which a liquid discharge head is integrated with a head tank. Examples of the liquid discharge device further include a device in which a liquid discharge head and a head tank are coupled to each other with a tube or the like to be integrated with each other. Here, a device including a filter may be added between a head tank of the liquid discharge device and a liquid discharge head thereof.

Examples of the liquid discharge device further include a device in which a liquid discharge head is integrated with a carriage.

Examples of the liquid discharge device further include a device in which a liquid discharge head is movably held by a guide member constituting a part of a main scanning movement mechanism and the liquid discharge head is integrated with the main scanning movement mechanism. Examples of the liquid discharge device further include a device in which a liquid discharge head, a carriage, and a main scanning movement mechanism are integrated with each other.

Examples of the liquid discharge device further include a device in which a cap which is a part of a maintenance recovery device is secured to a carriage to which a liquid discharge head is attached to integrate the liquid discharge head, the carriage, and the maintenance recovery device with each other.

Examples of the liquid discharge device further include a device in which a tube is coupled to a liquid discharge head to which a head tank or a channel component is attached to integrate the liquid discharge head with a supply mechanism. Via this tube, liquid in a liquid storage source is supplied to the liquid discharge head.

The main scanning movement mechanism also includes a single guide member. The supply mechanism also includes a single tube and a single loading unit.

Note that the "liquid discharge device" has been described in combination with the liquid discharge head here. However, the "liquid discharge device" also includes a device in which a head module including the above-described liquid discharge head and a head unit are integrated with the above-described functional component and mechanism.

The "liquid discharge apparatus" includes an apparatus including a liquid discharge head, a liquid discharge device, a head module, a head unit, and the like for driving the liquid discharge head to discharge liquid. The "liquid discharge apparatus" includes not only an apparatus capable of discharging liquid onto a liquid-attachable object but also an apparatus that discharges liquid toward gas or liquid.

This "liquid discharge apparatus" may also include a means related to feeding, conveying, or ejection of a liquid-attachable object, a pretreatment device, a post-treatment device, and the like.

Examples of the "liquid discharge apparatus" include an image forming apparatus that discharges ink to form an image on a sheet and a stereoscopic modeling apparatus (three-dimensional modeling apparatus) that discharges modeling liquid onto a powder layer obtained by forming powder into a layer shape in order to model a stereoscopic modeled object (three-dimensional modeled object).

The "liquid discharge apparatus" is not limited to an apparatus in which a significant image such as a letter or a figure is visualized by discharged liquid. Examples of the "liquid discharge apparatus" include an apparatus that forms a pattern or the like having no meaning by itself and an apparatus that models a three-dimensional image.

The "liquid-attachable object" means an object to which liquid can be attached at least temporarily, and means an object causing adhesion by attachment, an object causing permeation by attachment, or the like. Specific examples of the "liquid-attachable object" include a recording medium such as a sheet, recording paper, a recording sheet, a film, or a cloth, an electronic component such as an electronic substrate or a piezoelectric element, and a medium such as a powder layer, an organ model, or a test cell. Unless particularly limited, the "liquid-attachable object" includes everything to which liquid is attached.

A material of the "liquid-attachable object" may be any material as long as liquid can be attached to the object even temporarily, for example, paper, yarn, fiber, cloth, leather, metal, plastic, glass, wood, or ceramics.

The "liquid discharge apparatus" includes an apparatus in which a liquid discharge head and a liquid-attachable object move relatively to each other, but is not limited thereto. Specific examples thereof include a serial type apparatus that moves a liquid discharge head and a line type apparatus that does not move a liquid discharge head.

Examples of the "liquid discharge apparatus" further include a treatment liquid application apparatus that discharges treatment liquid onto a sheet in order to apply the treatment liquid to a surface of the sheet, for example, in order to modify the surface of the sheet, and a spraying granulation apparatus that sprays composition liquid in which a raw material is dispersed in a solution via a nozzle to granulate fine particles of the raw material.

In the terms of the present application, image formation, recording, letter printing, photograph printing, printing, modeling, and the like are all synonymous.

Figure 23:
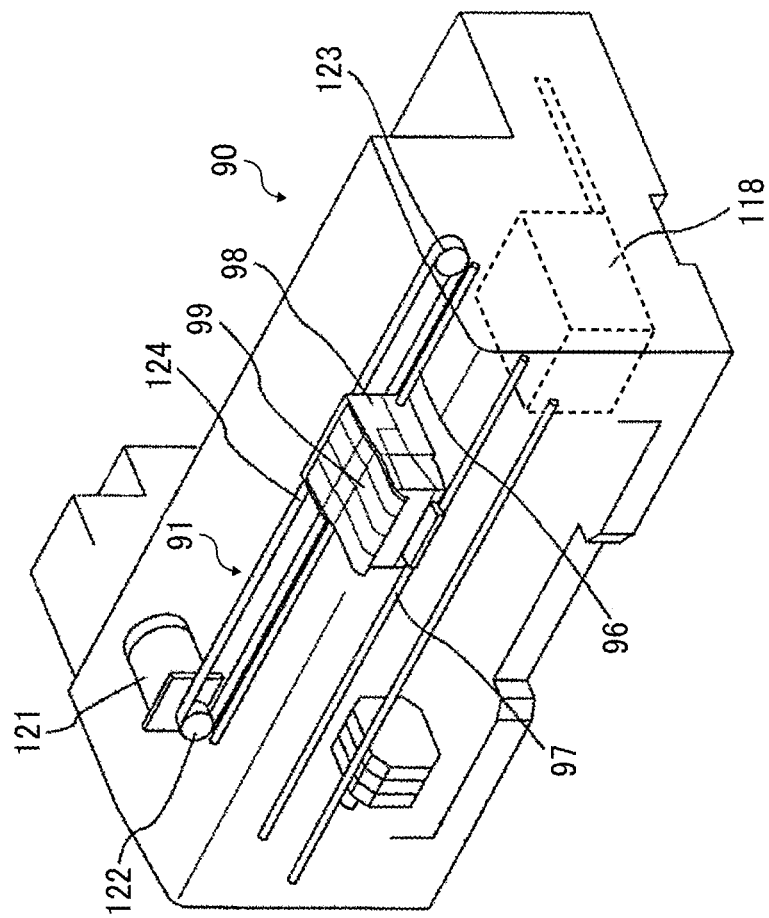
FIG. 23 is a perspective view illustrating a liquid discharge apparatus according to an embodiment of the present disclosure.
Figure 24:
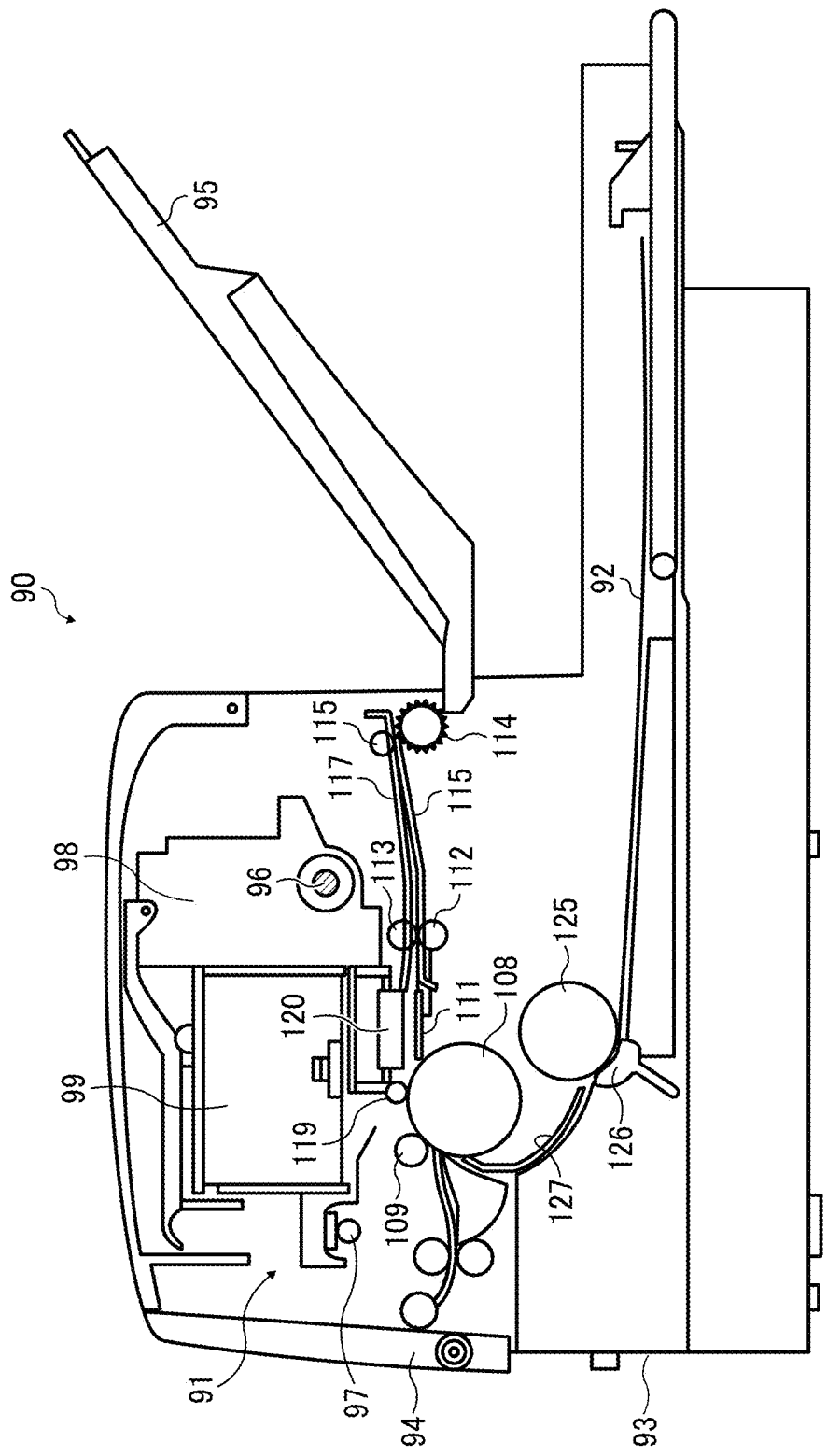
FIG. 24 is a side view illustrating a liquid discharge apparatus according to an embodiment of the present disclosure.

The liquid discharge apparatus will be further described with an inkjet recording apparatus as an example thereof. The inkjet recording apparatus of the present embodiment is illustrated in FIGS. 23 and 24.

An inkjet recording apparatus 90 houses, in an apparatus body, for example, a print mechanism section 91 including a carriage 98 that can move in a scanning direction, the liquid discharge head 1 mounted on the carriage 98, and an ink cartridge 99 that supplies ink to the liquid discharge head 1. To a lower part of the apparatus body, a sheet feed cassette (or sheet feed tray) 93 on which a large number of sheets 92 can be stacked from a front side is attached in a freely detachable manner. The inkjet recording apparatus 90 also includes a bypass tray 94 to be opened for manually feeding the sheet 92, takes in the sheet 92 fed from the sheet feed cassette 93 or the bypass tray 94, records a required image with the print mechanism section 91, and then ejects the sheet 92 to a sheet ejection tray 95 attached to a rear side.

The print mechanism section 91 holds a carriage 98 slidably in a main scanning direction with a main guide rod 96 and a sub-guide rod 97 which are guides laterally bridged on left and right side plates. In the carriage 98, the liquid discharge heads 1 that discharge ink droplets of colors of yellow (Y), cyan (C), magenta (M), and black (Bk) are arranged such that a plurality of ink discharge ports (nozzles) intersects with the main scanning direction, and attached with an ink droplet discharge direction downward. Each ink cartridge 99 for supplying ink of each color to the liquid discharge head 1 is attached to the carriage 98 in a replaceable manner.

The ink cartridge 99 has an air port that communicates with the atmosphere in an upper part thereof, a supply port that supplies ink to the liquid discharge head 1 in a lower part thereof, and a porous body filled with ink inside. The ink supplied to the liquid discharge head 1 is maintained at a slight negative pressure due to a capillary force of the porous body. Although the liquid discharge heads 1 of the colors are used as the liquid discharge heads 1, a single liquid discharge head having nozzles that discharge ink droplets of the colors may be used.

Here, the carriage 98 is slidably fitted to the main guide rod 96 on a rear side (downstream side in a sheet conveyance direction), and slidably mounted on the sub-guide rod 97 on a front side (upstream side in the sheet conveyance direction). In order to move the carriage 98 for scanning in the main scanning direction, a timing belt 124 is stretched between a driving pulley 122 and a driven pulley 123 that are rotationally driven by a main scanning motor 121, and the timing belt 124 is secured to the carriage 98. The carriage 98 is reciprocatingly driven by forward and reverse rotation of the main scanning motor 121.

Meanwhile, in order to convey the sheet 92 set in the sheet feed cassette 93 to a lower side of the liquid discharge head 1, a sheet feed roller 125 and a friction pad 126 that separate and feed the sheet 92 from the sheet feed cassette 93, a guide 127 that guides the sheet 92, a conveyance roller 108 that reverses and conveys the fed sheet 92, a conveyance roller 109 that is pressed against a peripheral surface of the conveyance roller 108, and a leading-end roller 119 that defines a feeding angle of the sheet 92 from the conveyance roller 108 are disposed. The conveyance roller 108 is rotationally driven by a sub-scanning motor via a gear train.

A print receiving member 111, which is a sheet guide for guiding the sheet 92 fed from the conveyance roller 108 on a lower side of the liquid discharge head 1 corresponding to a movement range of the carriage 98 in the main scanning direction, is disposed. On a downstream side of the print receiving member 111 in a sheet conveyance direction, a conveyance roller 112 and a spur roller 113 that are rotationally driven for sending out the sheet 92 in a sheet ejection direction are disposed. Furthermore, a sheet ejection a roller 114 and a spur 115 that send out the sheet 92 to the sheet ejection tray 95, and guides 116 and 117 forming a sheet ejection path are disposed.

During recording in the inkjet recording apparatus 90, the liquid discharge head 1 is driven according to an image signal while the carriage 98 is moved. Ink is thereby discharged onto the sheet 92 being stopped to record one line, and then the sheet 92 is conveyed by a predetermined amount. Thereafter, a subsequent line is recorded. Upon receiving a recording end signal or a signal indicating that a trailing edge of the sheet 92 has reached a recording area, recording operation is terminated and the sheet 92 is ejected. At a position outside the recording area on a right end side of the carriage 98 in a movement direction thereof, a recovery device 118 for recovering discharge failure of the liquid discharge head 1 is disposed. The recovery device 118 includes a capping means, a suction means, and a cleaning means. While waiting for printing, the carriage 98 is moved to a side of the recovery device 118, and the liquid discharge head 1 is capped by the capping means. A discharge port is kept in a wet state to prevent discharge failure due to ink drying. Ink not related to recording during recording or the like is discharged, and the ink viscosity at all the discharge ports is thereby made constant to maintain a stable discharging state.

For example, when discharge failure occurs, the discharge port (nozzle) of the liquid discharge head 1 is sealed with the capping means, and bubbles and the like are discharged together with ink from the discharge port with the suction means through a tube. As a result, ink, dust, or the like adhering to a surface of the discharge port is removed by the cleaning means to recover the discharge failure. The sucked ink is discharged to a waste ink reservoir disposed at a lower part of the body, and is absorbed and held by an ink absorber inside the waste ink reservoir.

As described above, the inkjet recording apparatus 90 includes the liquid discharge head 1 manufactured in the present disclosure, and therefore exhibits stable ink discharge characteristics to improve image quality. In the above description, the case where the liquid discharge head 1 is used in the inkjet recording apparatus 90 has been described. However, the liquid discharge head 1 may be applied to, for example, an apparatus that discharges liquid other than ink such as a liquid resist for patterning.

EXAMPLES

Hereinafter, the present disclosure will be described more specifically with reference to Examples and Comparative Examples, but the present disclosure is not limited by these Examples.

Example 1

A diaphragm plate was formed on a silicon wafer as a substrate by LPCVD and ALD methods. Specifically, for the diaphragm plate, a silicon oxide film having a thickness of 1000 nm was formed by a heat treatment film formation method, and then a silicon nitride film having a film thickness of 240 nm was formed by the LPCVD method. Next, an $Al_2O_3$ film was formed by the ALD method to form an amorphous layer having a film thickness of nm. Next, an adhesion layer formed by a titanium film having a film thickness of 20 nm was formed, and oxidized by a rapid thermal annealing (RTA) method to be formed into titanium oxide. Furthermore, a platinum film having a film thickness of 160 nm was formed as a lower electrode by sputtering. At this time, the substrate was heated at 550° C. when the platinum film was formed by sputtering. The titanium film as an adhesion layer is an adhesion layer between the metal oxide film ($Al_2O_3$ film) and the platinum film.

In preparing a piezoelectric thin film, a solution prepared at a composition ratio of Pb:Zr:Ti=110:53:47 was prepared. For synthesis of a specific precursor coating liquid, lead acetate trihydrate, isopropoxide titanium, and isopropoxide zirconium were used as starting materials. Crystal water of lead acetate was dissolved in methoxyethanol and then dehydrated. The lead amount was excessive with respect to a stoichiometric composition. This is for preventing crystallinity deterioration due to so-called lead loss during a heat treatment. Next, isopropoxide titanium and isopropoxide zirconium were dissolved in methoxyethanol, an alcohol exchange reaction and an esterification reaction were caused to proceed, and the resulting product was mixed with the above-described methoxyethanol solution in which lead acetate was dissolved to synthesize a PZT precursor solution. The PZT precursor solution had a concentration of 0.5 mol/l.

Using the PZT precursor solution, a thin film was formed by spin coating. After film formation, the film was dried at 120° C. and pyrolyzed at 400° C. The third layer was pyrolyzed, and then a crystallization heat treatment was performed at a temperature of 700° C. by RTA that is rapid thermal annealing. At this time, PZT had a film thickness of 240 nm. This step was performed eight times in total to obtain a PZT film having 24 layers and a film thickness of about 2 μm.

Next, as the upper electrode, an SrRuO$_3$ film having a film thickness of 40 nm was formed, and a platinum Pt film having a film thickness of 125 nm was further formed by sputtering. Thereafter, a film of a photoresist (TSMR8800) manufactured by Tokyo Ohka Kogyo Co., Ltd. was formed by a spin coating method, and a resist pattern was formed by photolithography. Thereafter, a pattern was formed using an ICP etching apparatus (manufactured by Samco Inc.). A piezoelectric thin-film element was manufactured as described above.

When a cross section of the obtained piezoelectric thin-film element was observed with a transmission electron microscope (TEM), an image as illustrated in FIG. 4 was obtained. As illustrated in FIG. 4, Pb derived from the piezoelectric film was trapped by the amorphous layer.

By using the obtained piezoelectric thin-film element, the silicon wafer constituting the substrate was processed to form a nozzle plate having a pressure chamber and a nozzle, thus manufacturing a liquid discharge head as illustrated in FIGS. 7 and 8. When discharge characteristics were evaluated using the obtained liquid discharge head, the discharge characteristics were good.

Example 2

A piezoelectric thin-film element was manufactured in a similar manner to Example 1 except that an SiO$_2$ film was used in place of the Al$_2$O$_3$ film as the amorphous layer in Example 1. When a liquid discharge head was manufactured in a similar manner to Example 1 and discharge characteristics thereof were evaluated, the discharge characteristics were good.

Comparative Example 1

A piezoelectric thin-film element was manufactured in a similar manner to Example 1 except that the amorphous layer had a thickness of 30 nm and the temperature of the crystallization heat treatment of the piezoelectric film was 750° C. in Example 1. When the obtained piezoelectric thin-film element was measured, Pb entered the amorphous layer, and Pb further reached the silicon nitride film as a lower layer.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:
1. A piezoelectric thin-film element, comprising:
a diaphragm plate on a substrate;
a lower electrode on the diaphragm plate;
a piezoelectric film on the lower electrode, the piezoelectric film containing Pb; and
an upper electrode on the piezoelectric film,
wherein the diaphragm plate is a laminate in which a silicon oxide layer, a silicon nitride layer, and an amorphous layer containing a metal oxide to trap Pb of the piezoelectric film are laminated in that order in a direction from the substrate to the lower electrode, and
the amorphous layer has a predetermined thickness to prevent Pb of the piezoelectric film from reaching the silicon nitride layer of the diaphragm plate.
2. The piezoelectric thin-film element according to claim 1,
wherein a thickness of the silicon oxide layer of the diaphragm plate is larger than a thickness of the silicon nitride layer of the diaphragm plate.
3. The piezoelectric thin-film element according to claim 1,
wherein the thickness of the amorphous layer of the diaphragm plate is 40 nm or more.
4. The piezoelectric thin-film element according to claim 1,
wherein the metal oxide of the amorphous layer of the diaphragm plate is silicon oxide or aluminum oxide.
5. A liquid discharge head comprising the piezoelectric thin-film element according to claim 1.
6. A head module comprising a plurality of liquid discharge heads, including the liquid discharge head according to claim 5, arranged in the head module.
7. A liquid discharge device comprising the head module according to claim 6.
8. A liquid discharge device comprising the liquid discharge head according to claim 5.
9. The liquid discharge device according to claim 8,
wherein the liquid discharge head is integrated as a single unit with at least one of:
a head tank configured to store the liquid to he supplied to the liquid discharge head;
a carnage on which the liquid discharge head is mounted;
a supply mechanism configured to supply the liquid to the liquid discharge head;
a maintenance recovery device configured to perform maintenance and recovery of the liquid discharge head; and
a main-scanning moving mechanism configured to move the liquid discharge head in a main scanning direction.
10. A liquid discharge apparatus comprising the liquid discharge device according to claim 8.
11. A liquid discharge apparatus comprising the head module according to claim 6.
12. A liquid discharge apparatus comprising e liquid discharge head according to claim 5.
13. A method for manufacturing the piezoelectric thin-film element according to claim 1,
the method comprising forming the silicon oxide layer, the silicon nitride layer, and the amorphous layer containing the metal oxide to trap Ph of the piezoelectric film in turn on the substrate to form the diaphragm plate,
wherein the forming forms the amorphous layer at the thickness of preventing Pb of the piezoelectric film from reaching the silicon nitride layer.
14. The piezoelectric thin-film element of claim 1, further comprising an adhesive layer directly between and contacting both the lower electrode and the amorphous layer of the diaphragm plate.

15. The piezoelectric thin-film element of claim 1, wherein the diaphragm plate includes the silicon oxide layer, the silicon nitride layer, and the amorphous layer in that order, and no other layers.

* * * * *